United States Patent
Iyer et al.

(10) Patent No.: US 9,520,178 B2
(45) Date of Patent: Dec. 13, 2016

(54) METHODS AND APPARATUS FOR DESIGNING AND CONSTRUCTING DUAL WRITE MEMORY CIRCUITS WITH VOLTAGE ASSIST

(71) Applicant: Cisco Technology, Inc., San Jose, CA (US)

(72) Inventors: Sundar Iyer, Palo Alto, CA (US); Shang-Tse Chuang, Los Altos, CA (US); Thu Nguyen, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/831,008

(22) Filed: Aug. 20, 2015

(65) Prior Publication Data
US 2015/0357030 A1    Dec. 10, 2015

Related U.S. Application Data

(63) Continuation of application No. 14/274,518, filed on May 9, 2014, now Pat. No. 9,147,466, which is a continuation of application No. 13/421,704, filed on Mar. 15, 2012, now Pat. No. 8,760,958.

(51) Int. Cl.
| | |
|---|---|
| *G11C 7/22* | (2006.01) |
| *G11C 11/419* | (2006.01) |
| *G11C 11/412* | (2006.01) |
| *G11C 11/413* | (2006.01) |
| *G11C 8/16* | (2006.01) |

(52) U.S. Cl.
CPC .............. *G11C 11/419* (2013.01); *G11C 8/16* (2013.01); *G11C 11/412* (2013.01); *G11C 11/413* (2013.01)

(58) Field of Classification Search
CPC .............. H01L 27/1104; H01L 27/0207; H01L 21/823475; H01L 27/088; H01L 29/42356; H01L 29/4916; H01L 29/66969; H01L 21/823814; H01L 27/11; G11C 11/419; G11C 11/412; G11C 11/413; G11C 8/16
USPC ........... 365/230.05, 154, 189.15, 189.16, 63, 365/156, 189.04, 189.11, 189.19, 51
See application file for complete search history.

(56) References Cited

U.S. PATENT DOCUMENTS

| | | |
|---|---|---|
| 3,669,539 A | 6/1972 | Spence |
| 7,113,445 B1 | 9/2006 | Sancheti et al. |
| 2008/0112212 A1* | 5/2008 | Wang ....................... G11C 8/08 365/154 |
| 2013/0148429 A1 | 6/2013 | Kim et al. |

* cited by examiner

*Primary Examiner* — Thong Q Le
(74) *Attorney, Agent, or Firm* — Edell, Shapiro & Finnan, LLC

(57) ABSTRACT

Static random access memory (SRAM) circuits are used in most digital integrated circuits to store representations of data bits. To handle multiple concurrent memory requests, an efficient dual-port six transistor (6T) SRAM bit cell is proposed. The dual-port 6T SRAM cell uses independent word lines and bit lines such that the true/data side and the false/data-complement side of the SRAM bit cell may be accessed independently. Single-ended reads allow the two independent word lines and bit lines to handle two independent read operations in a single cycle using spatial domain multiplexing. Single-ended writes are enabled by adjusting the $V_{DD}$ power voltage supplied to a memory cell when writes are performed such that a single word line and bit line pair can be used write either a logical "0" or logical "1" into either side of the SRAM bit cell.

20 Claims, 25 Drawing Sheets

$$V_L = \frac{1V \times R}{(R+R)} = \frac{1V \times R}{2R} = \frac{W}{2} = \text{flip?}$$

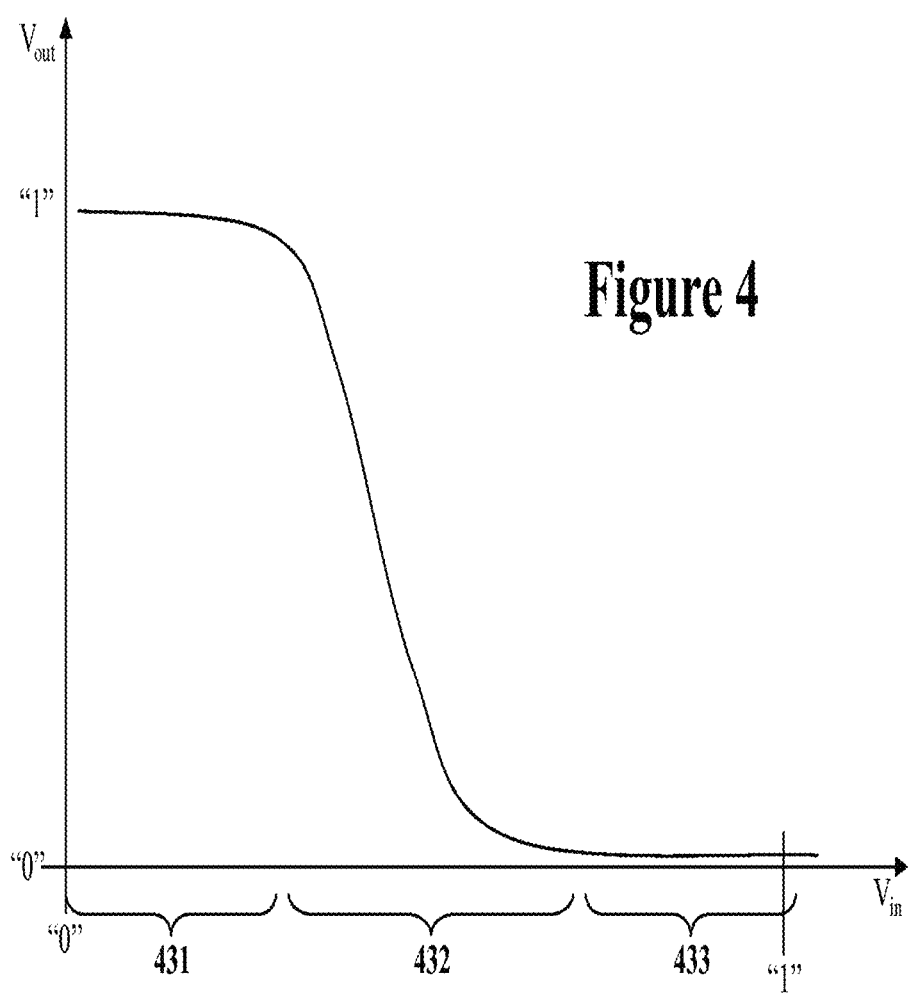

FIG. 6D
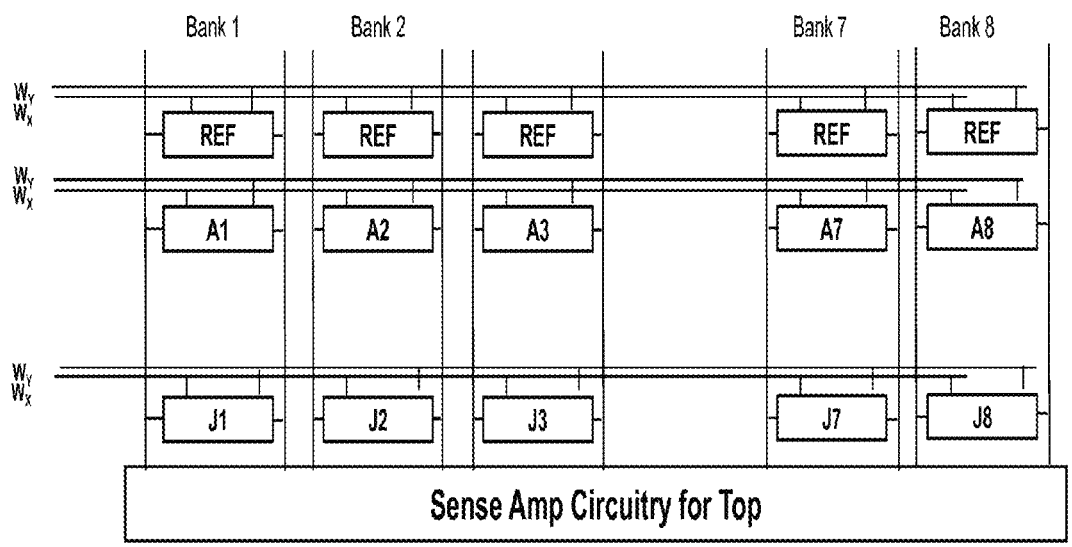
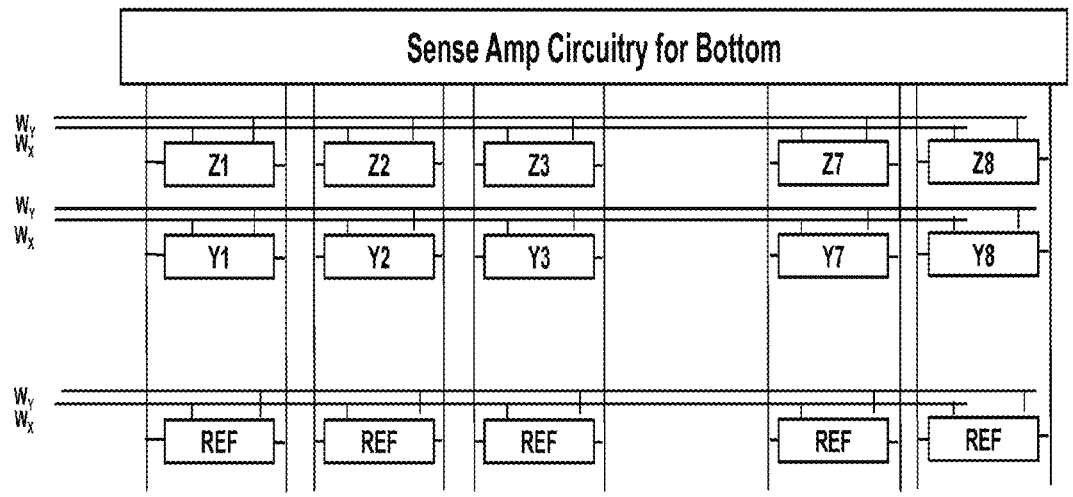

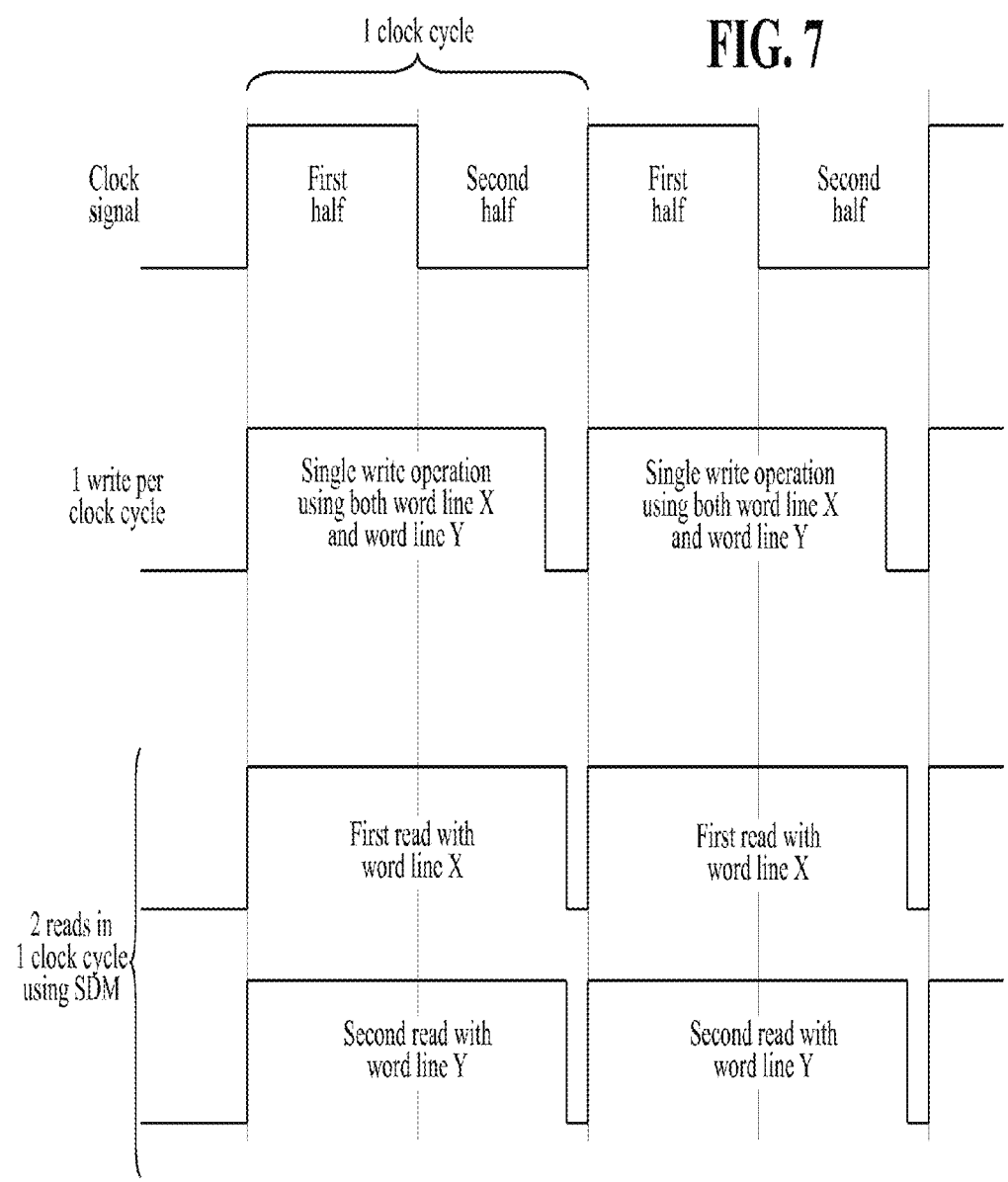

$$V_L = \frac{1V \times 2R}{(2R+R)} = \frac{1V \times 2R}{3R} = \frac{2V}{3}$$

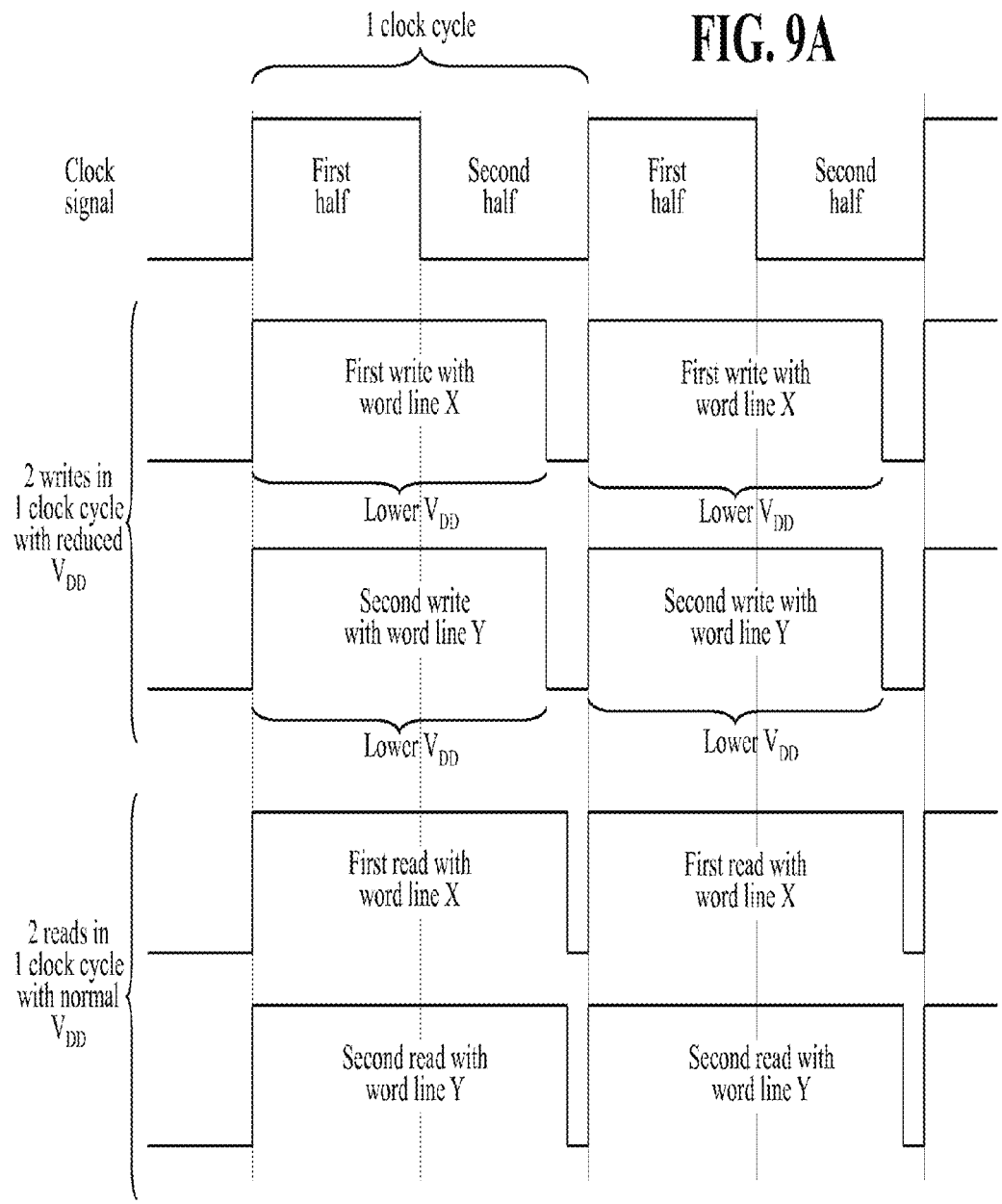

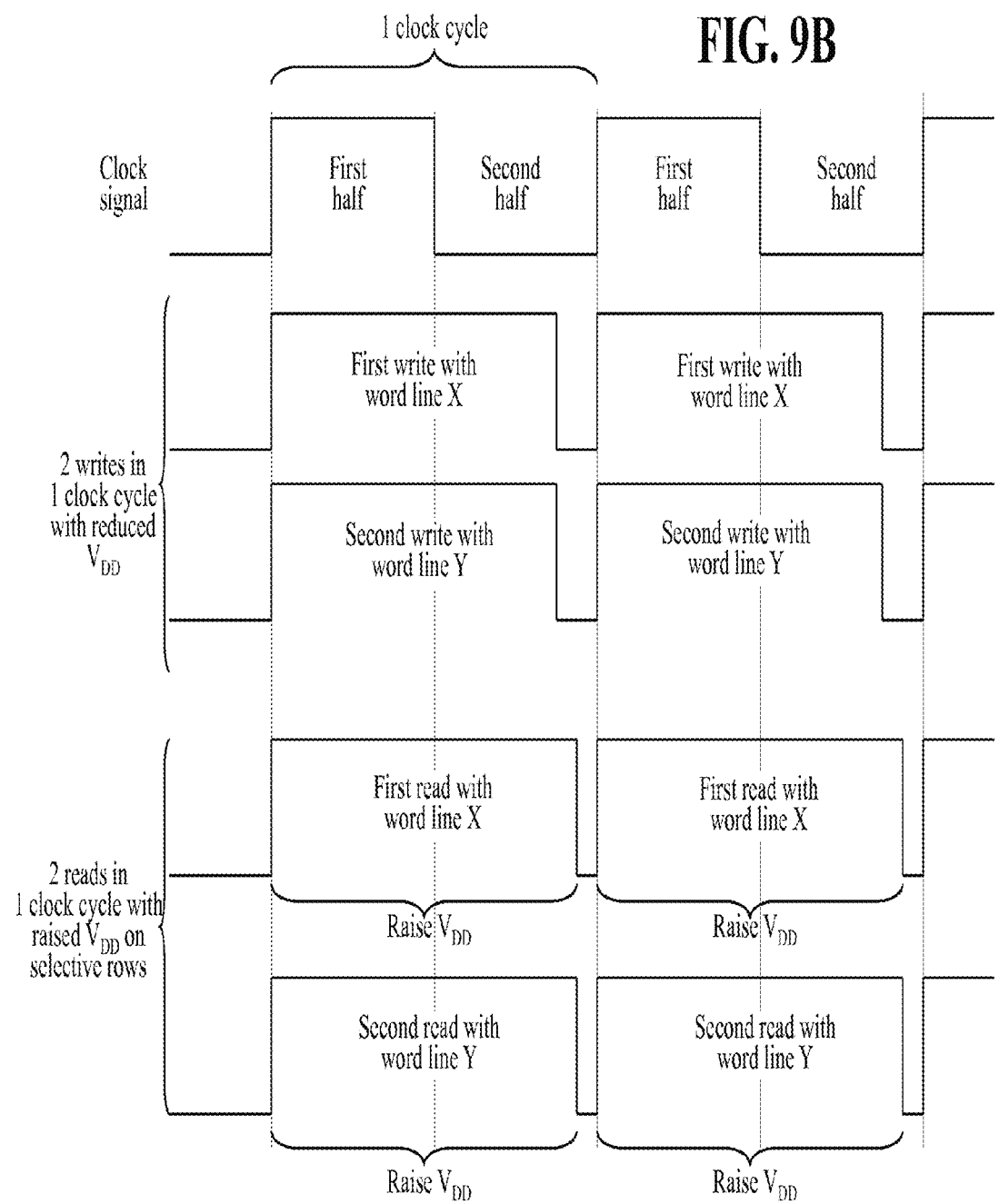

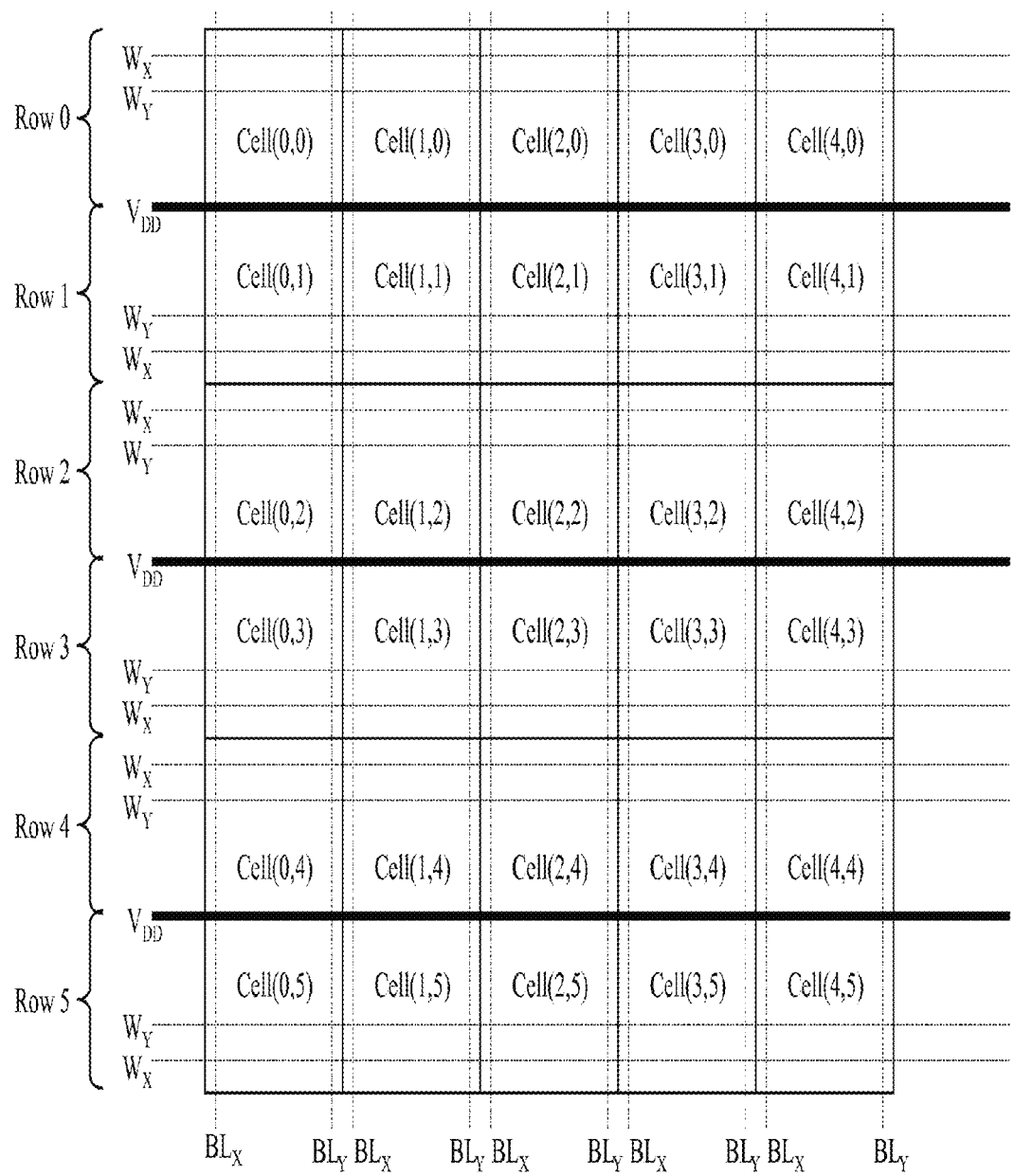

METHODS AND APPARATUS FOR DESIGNING AND CONSTRUCTING DUAL WRITE MEMORY CIRCUITS WITH VOLTAGE ASSIST

CROSS-REFERENCE TO RELATED APPLICATIONS

The present application is a continuation of U.S. patent application Ser. No. 14/274,518, filed May 9, 2014, which in turn is a continuation of U.S. patent application Ser. No. 13/421,704, filed Mar. 15, 2012, now U.S. Pat. No. 8,760,958, these applications are hereby incorporated herein by reference in their entireties.

TECHNICAL FIELD

The present invention relates to the field of digital memory circuits. In particular, but not by way of limitation, the present invention discloses techniques for designing and constructing multi-port memory circuits using a voltage assist.

BACKGROUND

Most digital memory circuits are "single port" memory devices that can only be read from or written to by a single user at a time. For example, the well-known standard six-transistor (6T) SRAM bit cell only has a single port into the bit cell for reading or writing data bit values. However, for many applications it is desirable to have "multi-port" memory systems where more than one memory user can read from single memory cell at the same time. For example, in a multi-core processor system it is advantageous to allow multiple cores to read from the same memory address concurrently.

To allow for more than one memory reader to concurrently access a single memory bit cell, the circuit design of the memory bit cell may be altered to include more physical ports into the memory bit cell. For example, the standard single-port 6T SRAM bit cell may be made into a dual-port memory cell by inserting two additional transistors into the memory bit cell circuit that implement a second physical port for accessing the data bit stored in the memory bit cell. Such dual-port 8T SRAM bit cells are often used when a digital system needs the ability to perform two concurrent memory accesses.

Adding two additional transistors into a memory cell allows for two concurrent readers of the memory cell but reduces other important metrics of the memory bit cell. Specifically, inserting two additional transistors increases the size of the memory bit cell and thus reduces the memory density of an array created from the 8T SRAM cells. Furthermore, due to the risk of losing the value of the data bit currently stored in the SRAM bit cell if two concurrent read operations are received, certain transistors in the dual-port 8T SRAM bit cell must be made much larger thus further increasing the size of the dual-port 8T SRAM bit cell and reducing memory density. Adding additional ports (such as a third or fourth port) by adding even more transistors further compounds these problems. Thus, as a result, multi-port memory bit cells tend to have very low memory density metrics. The additional transistors will also require additional power to operate such that multi-port memory systems will also consume more power than single port memory systems. Therefore, it would be desirable to have alternative circuit designs for implementing multi-port memory cells.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 4 illustrates a transfer function for a typical inverter circuit.

FIG. 6D illustrates a block diagram of a memory array constructed with the dual-port 6T SRAM bit cell of FIG. 6A that has sense amplifiers located in the center of the array.

FIG. 7 illustrates a timing diagram for a memory system that performs either one write (1W) operation per cycle or two read (2R) operations per cycle.

FIG. 9A illustrates a timing diagram of two concurrent write operations performed in a single cycle by lowering the $V_{DD}$ power voltage to enable single-ended writes.

FIG. 9B illustrates a timing diagram for a memory system with a reduced operating $V_{DD}$ power voltage that handles two concurrent read operations by raising the $V_{DD}$ power voltage provided to the rows being read.

FIG. 10 illustrates a high-level layout diagram of a subsection of split word line memory cells within a memory array.

DETAILED DESCRIPTION

The following detailed description includes references to the accompanying drawings, which form a part of the detailed description. The drawings show illustrations in accordance with example embodiments. These embodiments, which are also referred to herein as "examples," are described in enough detail to enable those skilled in the art to practice the invention. It will be apparent to one skilled in the art that specific details in the example embodiments are not required in order to practice the present invention. For example, although some of the example embodiments are disclosed with reference to computer processing systems used for packet-switched networks, the teachings can be used in many other environments. Thus, any digital system that uses digital memory can benefit from the teachings of the present disclosure. The example embodiments may be combined, other embodiments may be utilized, or structural, logical and electrical changes may be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Computer Systems

Figure 1:
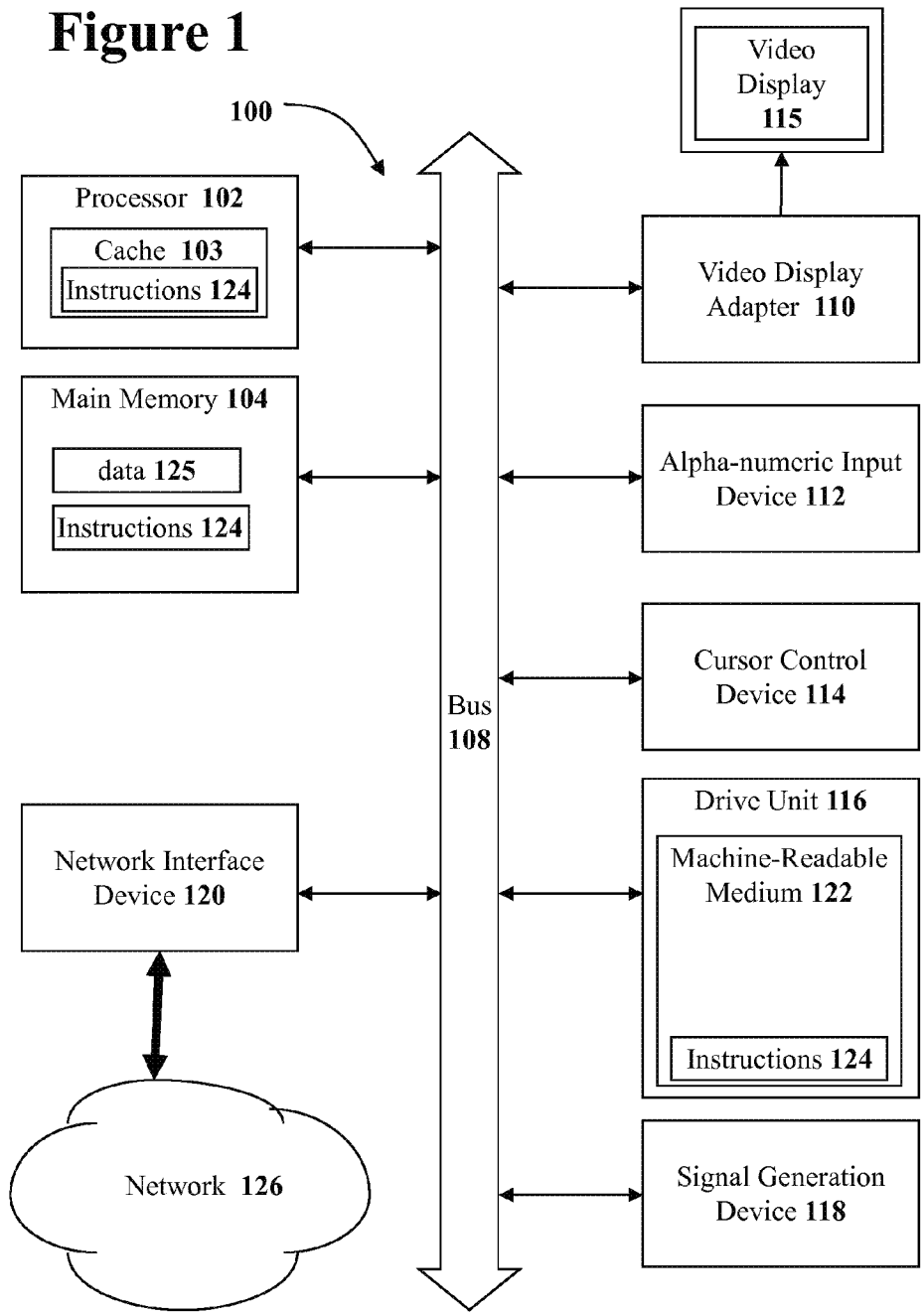
FIG. 1 illustrates a computer system within which a set of instructions, for causing the machine to perform any one or more of the methodologies discussed herein, may be executed.

The present disclosure concerns digital memory devices that are often used in computer systems. FIG. 1 illustrates a diagrammatic representation of a machine in the example form of a computer system 100 that may be used to implement portions of the present disclosure. Within computer system 100 of FIG. 1, there are a set of instructions 124 that may be executed for causing the machine to perform any one or more of the methodologies discussed within this document. Furthermore, while only a single computer is illustrated, the term "computer" shall also be taken to include any collection of machines that individually or jointly execute a set (or multiple sets) of instructions to perform any one or more of the methodologies discussed herein.

The example computer system 100 of FIG. 1 includes a processor 102 (e.g., a central processing unit (CPU), a graphics processing unit (GPU) or both) and a main memory 104 and a static memory 106, which communicate with each other via a bus 108. The computer system 100 may further include a video display adapter 110 that drives a video display system 115 such as a Liquid Crystal Display (LCD). The computer system 100 also includes an alphanumeric input device 112 (e.g., a keyboard), a cursor control device 114 (e.g., a mouse or trackball), a disk drive unit 116, a signal generation device 118 (e.g., a speaker) and a network interface device 120. Note that not all of these parts illustrated in FIG. 1 will be present in all embodiments. For example, a computer server system may not have a video display adapter 110 or video display system 115 if that server is controlled through the network interface device 120.

The disk drive unit 116 includes a machine-readable medium 122 on which is stored one or more sets of computer instructions and data structures (e.g., instructions 124 also known as 'software') embodying or utilized by any one or more of the methodologies or functions described herein. The instructions 124 may also reside, completely or at least partially, within the main memory 104 and/or within a cache memory 103 associated with the processor 102. The main memory 104 and the cache memory 103 associated with the processor 102 also constitute machine-readable media.

The instructions 124 may further be transmitted or received over a computer network 126 via the network interface device 120. Such transmissions may occur utilizing any one of a number of well-known transfer protocols such as the well-known File Transport Protocol (FTP). While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein, or that is capable of storing, encoding or carrying data structures utilized by or associated with such a set of instructions. The term "machine-readable medium" shall accordingly be taken to include, but not be limited to, solid-state memories, optical media, and magnetic media.

For the purposes of this specification, the term "module" includes an identifiable portion of code, computational or executable instructions, data, or computational object to achieve a particular function, operation, processing, or procedure. A module need not be implemented in software; a module may be implemented in software, hardware/circuitry, or a combination of software and hardware.

Static Random Access Memory (SRAM) Overview

Figure 2A:
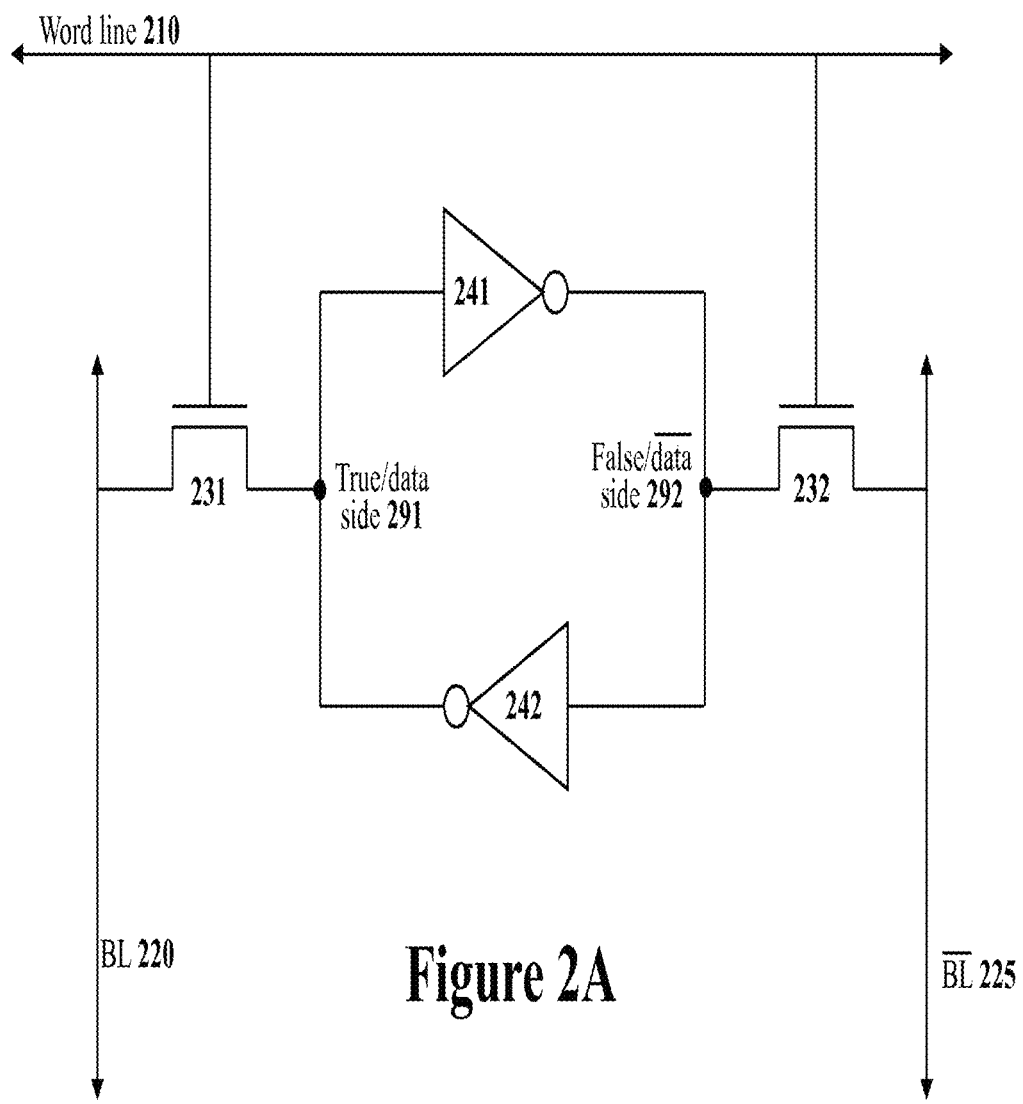
FIG. 2A illustrates a typical six transistor (6T) SRAM bit cell.

A static random access memory (SRAM) is a type of semiconductor memory circuit that stores each data bit in a simple memory cell circuit that often consists of a pair of connected inverters. FIG. 2A illustrates a typical SRAM cell comprising a pair of inverters 241 and 242. The inverters 241 and 242 are typically connected in a loop circuit wherein the output of each inverter is coupled to the input of the other inverter. One side of the memory cell circuit is referred to as the data or "true" side 291 that stores the data bit value and the other side of the memory cell circuit is referred to as the data-complement or "false" side 291 that stores the logical inverse of the stored data bit.

Figure 2B:
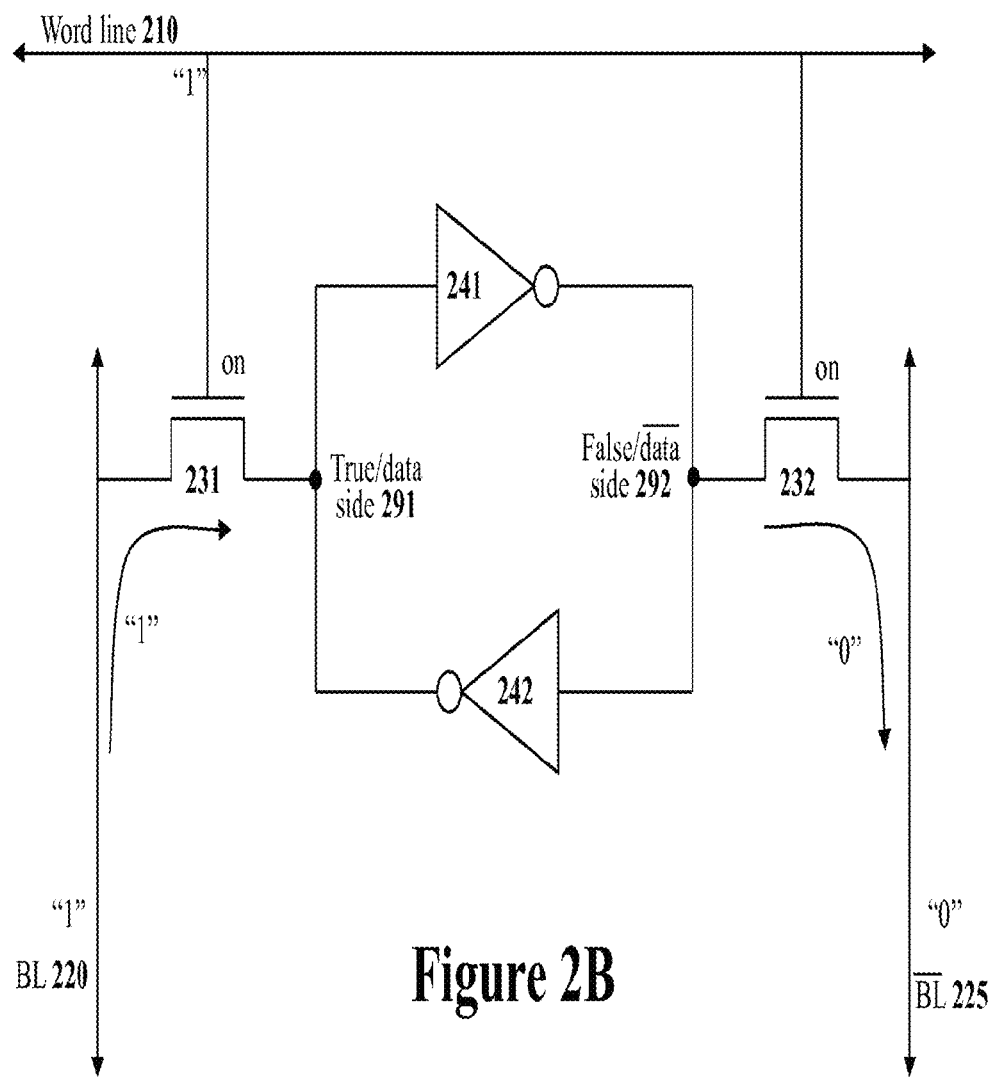
FIG. 2B illustrates the process of writing a logical one into the 6T SRAM bit cell of FIG. 2A.

To write a data bit into a memory cell or read a data bit from the memory cell, there are a pair of port transistors 231 and 232 that are coupled to a common word line 210. The port transistors 231 and 232 receive data from (for write operations) or drive data onto (for read operations) a complementary pair of data bit lines: bit line (BL) 220 and bit line complement 225. FIG. 2B illustrates writing a "1" data bit (generally represented by a positive voltage value) into the data (or "true") side 291 and "0" data bit (generally represented by ground) into the data-complement (or "false") side 292 of the memory cell through port transistors 231 and 232, respectively.

Figure 2C:
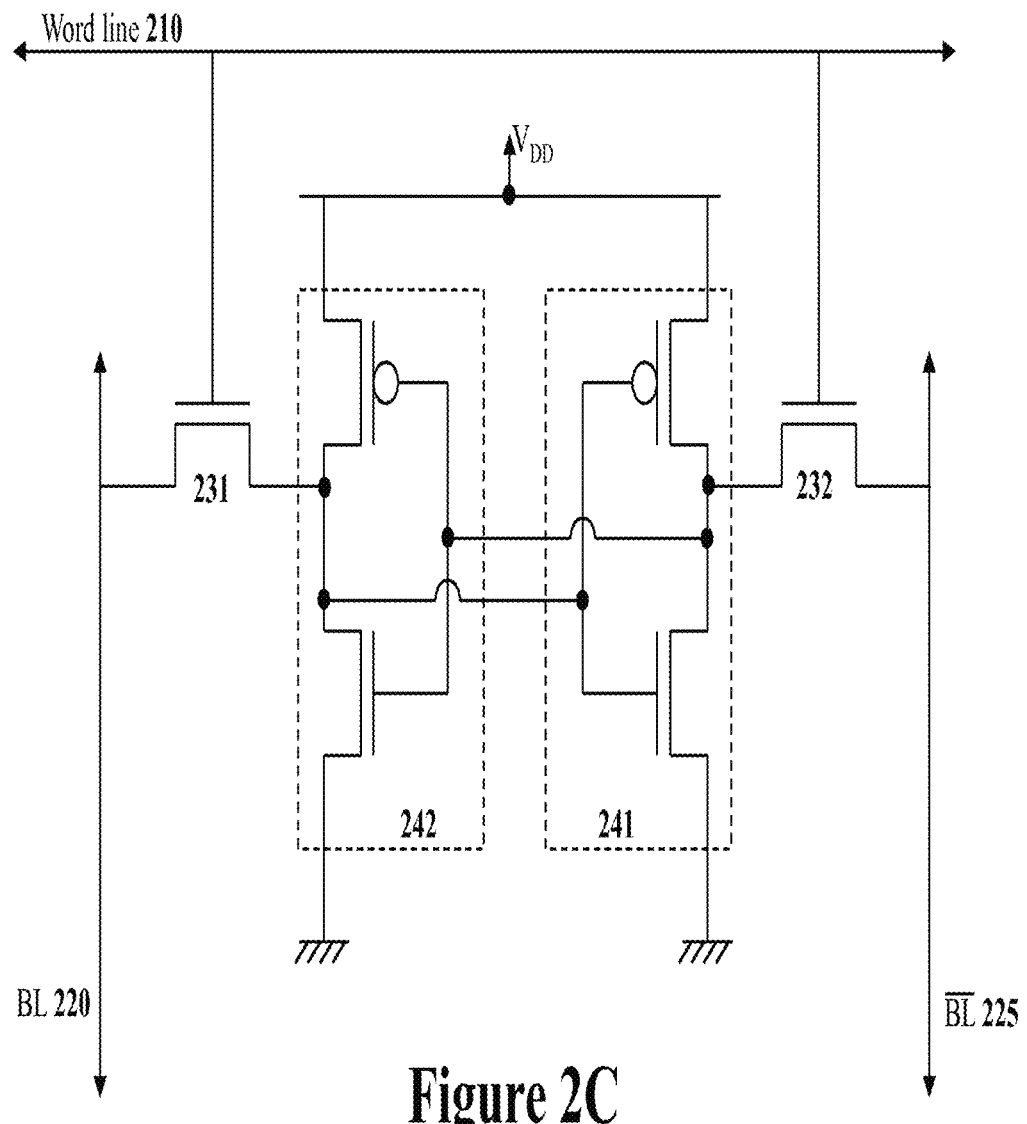
FIG. 2C illustrates a full transistor view of the 6T SRAM bit cell from FIG. 2A.

FIG. 2C illustrates the SRAM cell FIG. 2A with the inverter symbols replaced with a set of four transistors used to implement the two inverter circuits 241 and 242. Each inverter circuit is implemented with two transistors: a P1v1OS transistor and a NMOS transistor. Since there are two transistors for each of the two inverter circuits and there are two transistors (231 and 232) used for ports into the memory cell, the SRAM cell of FIGS. 2A to 2C is commonly known as a six-transistor (6T) SRAM bit cell.

The physical geometry of the integrated circuit components used to construct a 6T SRAM cell is very important in order to guarantee proper operation of the 6T SRAM cell. For example, if the NMOS transistor in the inverter is the same physical size as the NMOS transistor used as a port transistor into the 61' SRAM bit cell then the 6T SRAM bit cell may unintentionally lose store data during read operations. An illustration as to why the physical geometry is so important is set forth with reference to FIG. 3A.

Figure 3A:
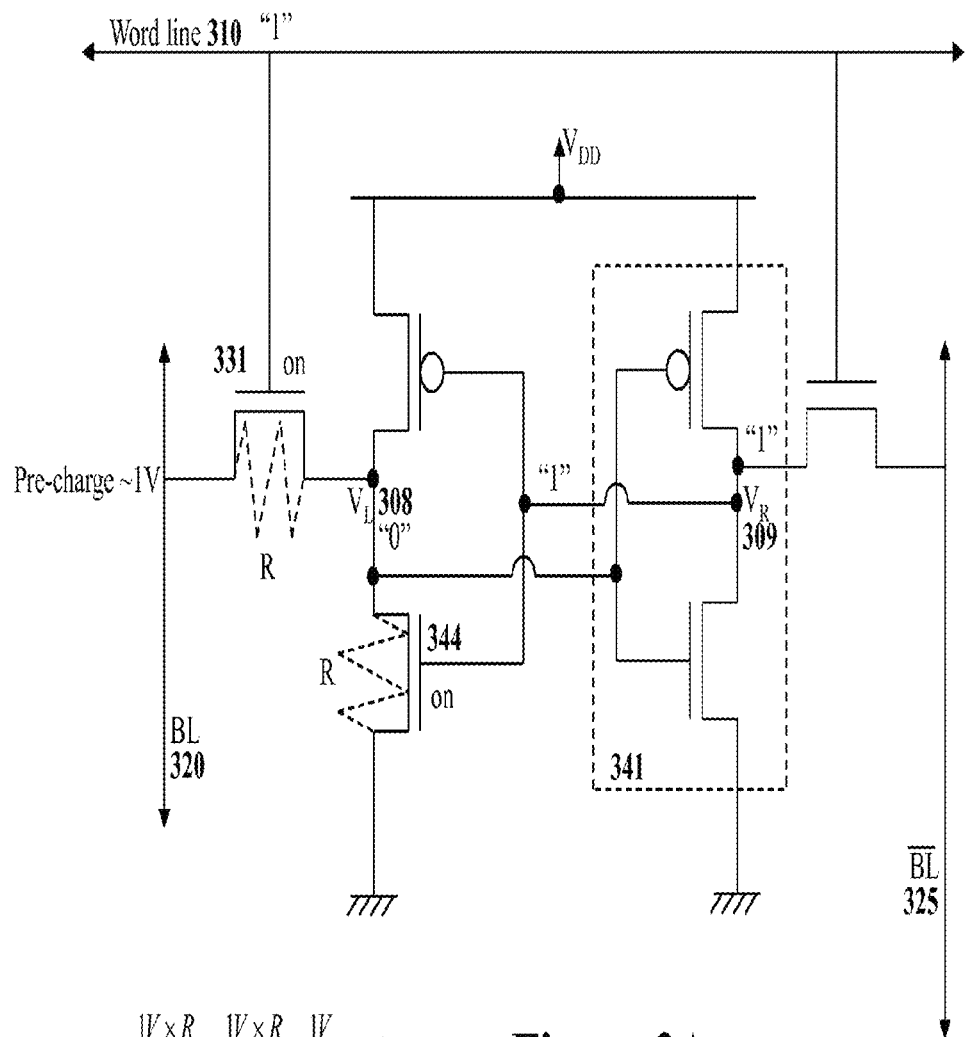
FIG. 3A illustrates a difficult situation encountered when reading the data bit stored in a typical 6T SRAM bit cell.

FIG. 3A illustrates an example of a 6T SRAM bit cell that currently stores a "0" data bit (on 'true' side 308 of the bit cell) that is being read from the 6T SRAM cell. The 'false' side 309 of the 6T SRAM cell stores a "1" bit that activates inverter NMOS transistor 344 such that NMOS transistor 344 is turned on. Similarly, the driving the word line 310 for the read operation activates port NMOS transistor 331 such that port transistor 31 is turned on. Thus, during a read of a 6T SRAM cell storing a "0" data bit, there is an electrical path from bit line 320 to the ground after inverter NMOS transistor 344. To simplify the analysis in this example, these two turned-on NMOS transistors (344 and 331) act similar to a pair resistors in series for time period during the actual read operation.

Before a reading a memory cell in a memory array, the memory system read circuitry generally pre-charges the bit line 320 for the read operation. Assuming port NMOS transistor 331 and inverter NMOS transistor 344 are created approximately the same size, the two NMOS transistors (344 and 331) may be assigned a resistance value of R Ohms. Thus, when the pre-charged voltage value on the bit line 320 accesses the data side at point $V_L$ 308 in the memory cell, port NMOS transistor 331 and inverter NMOS transistor 344 initially act as a voltage divider circuit that drives the voltage at point $V_T$, 308 to middle voltage level (between the pre-charge voltage and ground) since the two transistors have approximately the same resistance R Ohms. With the voltage at point $V_L$ 308 driven to middle voltage level, that middle voltage level may accidentally cause the data value state currently stored in the memory cell to flip.

Driving point $V_L$ 308 to middle voltage level (due to the pre-charge) may flip the data state of the memory bit cell since the inverter circuit 341 may be unintentionally triggered. FIG. 4 illustrates an inverter circuit transfer function.

When the input to an inverter circuit is in the low region 431 the output is high and when the input to an inverter circuit is in the high region 433 the output will be low. However, when an input voltage in the middle region 432, the output may be high, low, or in the middle depending on the input voltage and the specific inverter circuit. Specifically, due to manufacturing differences, the transfer function illustrated in FIG. 4 may be shifted to the left or right such that the output voltage will vary depending on the specific inverter geometry, doping, etc. Referring back to FIG. 3A, if the middle voltage value at point $V_1$ 308 is interpreted as high value then the inverter 341 (driven by the voltage at point $V_L$ 308) may be activated unintentionally flip the data value stored in the memory cell during the read operation.

Figure 3B:
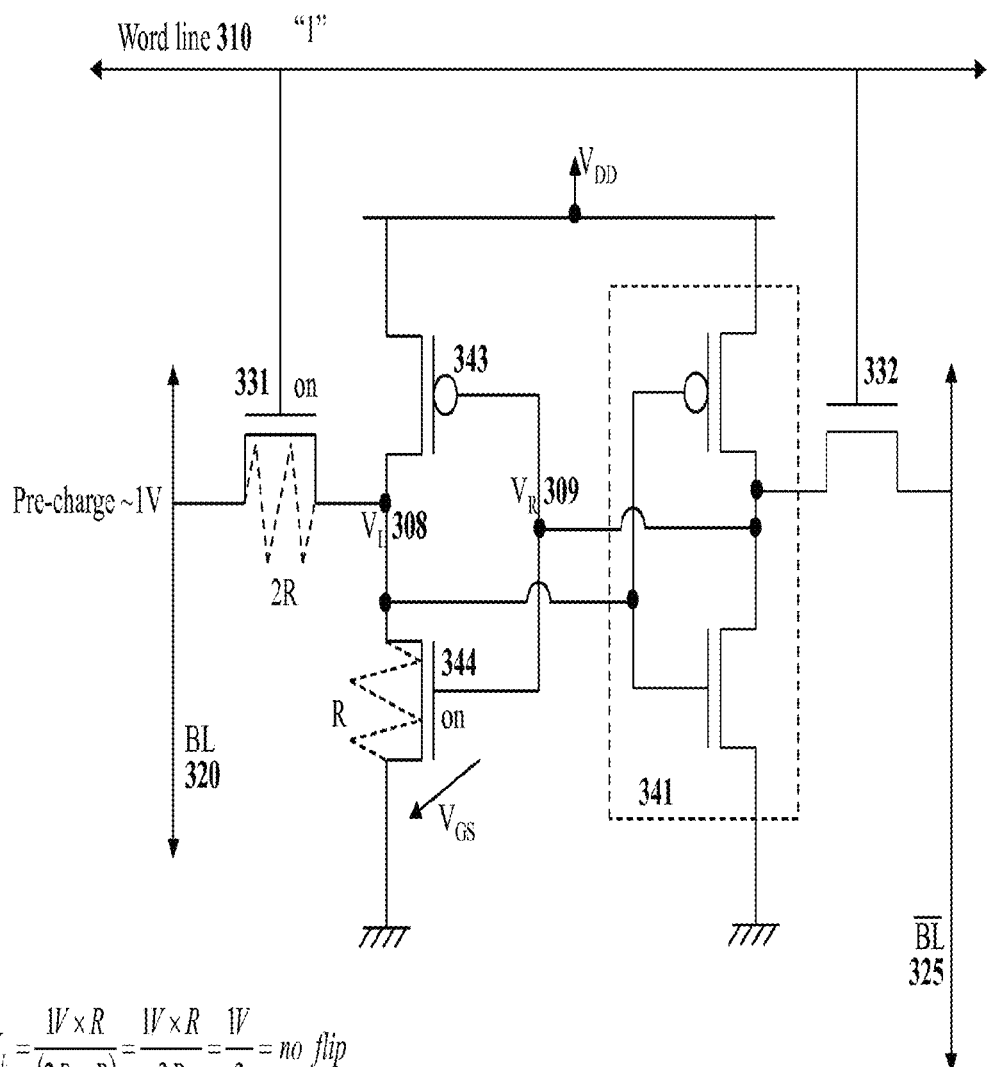
FIG. 3B illustrates how the difficult situation of FIG. 3A is handled with an inverter transistor that is larger than the port transistor.

The simplified example set forth in the preceding paragraphs illustrates how the pre-charge at the start of a read operation may accidentally destroy the data stored in a 6T SRAM cell. To prevent this from ever occurring, the size ratio of the inverter NMOS transistor 344 and the port NMOS transistor 331 must be carefully considered. Specifically, to prevent having read operations unintentionally flip the data value stored in the memory cell during a read operation, the inverter NMOS transistor 344 is generally made larger than the port NMOS transistor 331 such that inverter NMOS transistor 344 will more easily carry current when activated. Thus, when both of these two NMOS transistors are active (turned-on), the inverter NMOS transistor 344 will have a much lower resistance than the port NMOS transistor 331. An illustrative example is presented in FIG. 3B where inverter NMOS transistor 344 has a resistance R and port NMOS transistor 331 has twice the resistance with a resistance value of 2R. When the same read situation occurs, the voltage divider circuit will now have a much smaller voltage drop across inverter NM OS transistor 344 such that the voltage at point $V_L$ 308 will remain low despite the pre-charge thus ensuring that the 6T SRAM cell will retain the stored data bit value.

The physical size ratio of the inverter NMOS transistor 344 and the port NMOS transistor 331 is the important factor. If size ratio (inverter NMOS transistor 344)/(port NMOS transistor 331) is not large enough then the voltage at node $V_L$ 308 may reach the threshold voltage that activates inverter 341 thus causing the memory cell to invert the stored data value during the read operation. The higher the (inverter NMOS transistor 344)/(port NMOS transistor 331) size ratio is the lower the voltage at node $V_L$ 308 will be during the pre-charge. But to keep the memory cell as small as possible, the ratio should only be as high as necessary to prevent data corruption. In many 6T SRAM cells, the size ratio is 1.2 to 1.5.

8T Dual-Port SRAM Bit Cell

In many memory applications, it is desirable to allow two different entities to access the same memory system concurrently. Occasionally, the two different entities may attempt to access the very same SRAM bit cell at the same time. For example, in a multi-core processor system more than one of the different processing cores may attempt to access the same memory cell at the same time. To allow for such concurrent memory accesses, a second physical port into a memory cell may be added to the memory cell circuitry.

Figure 5A:
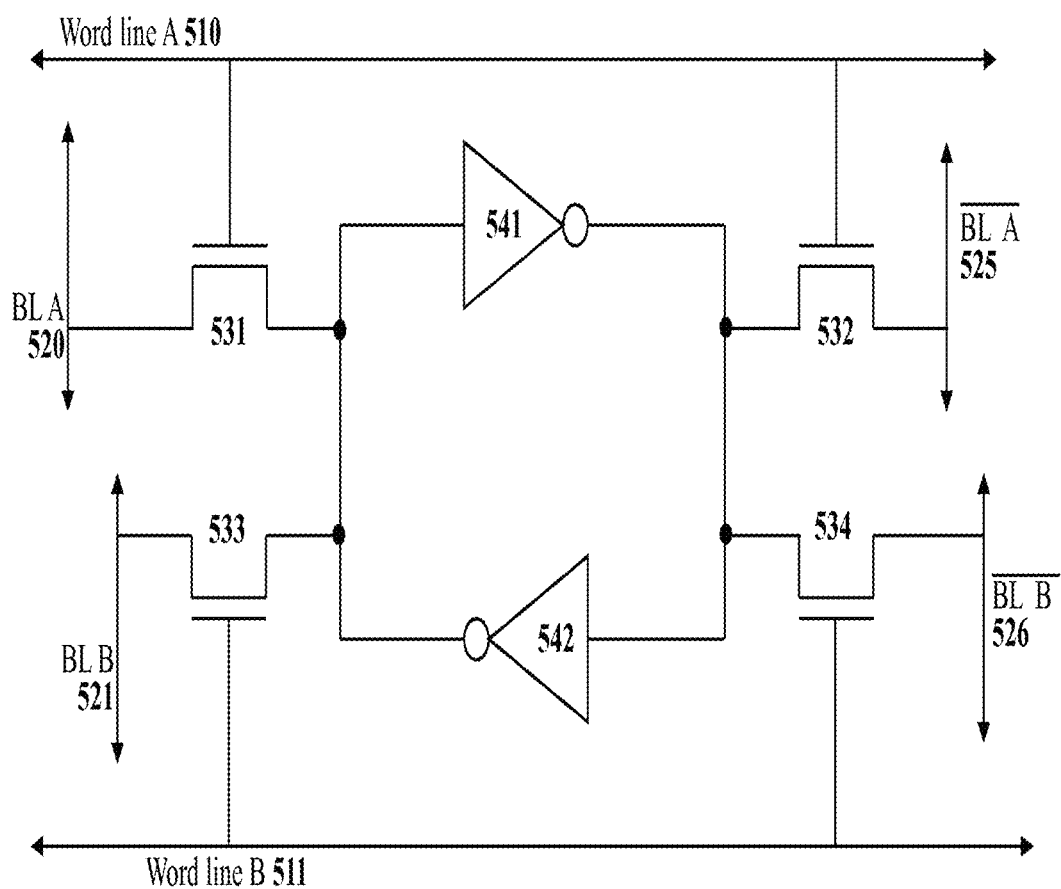
FIG. 5A illustrates a typical dual-port eight transistor (8T) SRAM bit cell.

FIG. 5A illustrates an example of a typical dual-port SRAM cell that can handle two completely independent but concurrent memory accesses. The dual-port SRAM cell of FIG. 5A is similar to the 6T SRAM cell of FIG. 2A except that in addition to the first pair of complementary port transistors 531 and 532, the dual-port memory cell of FIG.

5A also includes a second pair of complementary port transistors 533 and 534. The second pair of complementary port NMOS transistors 533 and 534 are controlled by second word line (word line B) 511. Similarly, the second pair of complementary port transistors 533 and 534 also have their own respective bit lines (data bit line B 521 and data bit line B complement 526). Since two more transistors were added to the memory cell circuit, the memory circuit of FIG. 5A is typically referred to as a dual-port 8T SRAM cell.

The addition of a second set of complementary port transistors (533 and 534), a second set of complementary bit lines (521 and 526), and an additional word line (511) allows two different entities to concurrently access the contents of the 8T SRAM cell independently of each other. However, this ability to concurrently access the SRAM cell using the two independent ports comes at a cost of significantly increasing the physical size of the SRAM cell due to the additional area required to accommodate the additional complementary port transistors (533 and 534), the additional complementary bit lines (521 and 526), and the additional word line (511).

Figure 5B:
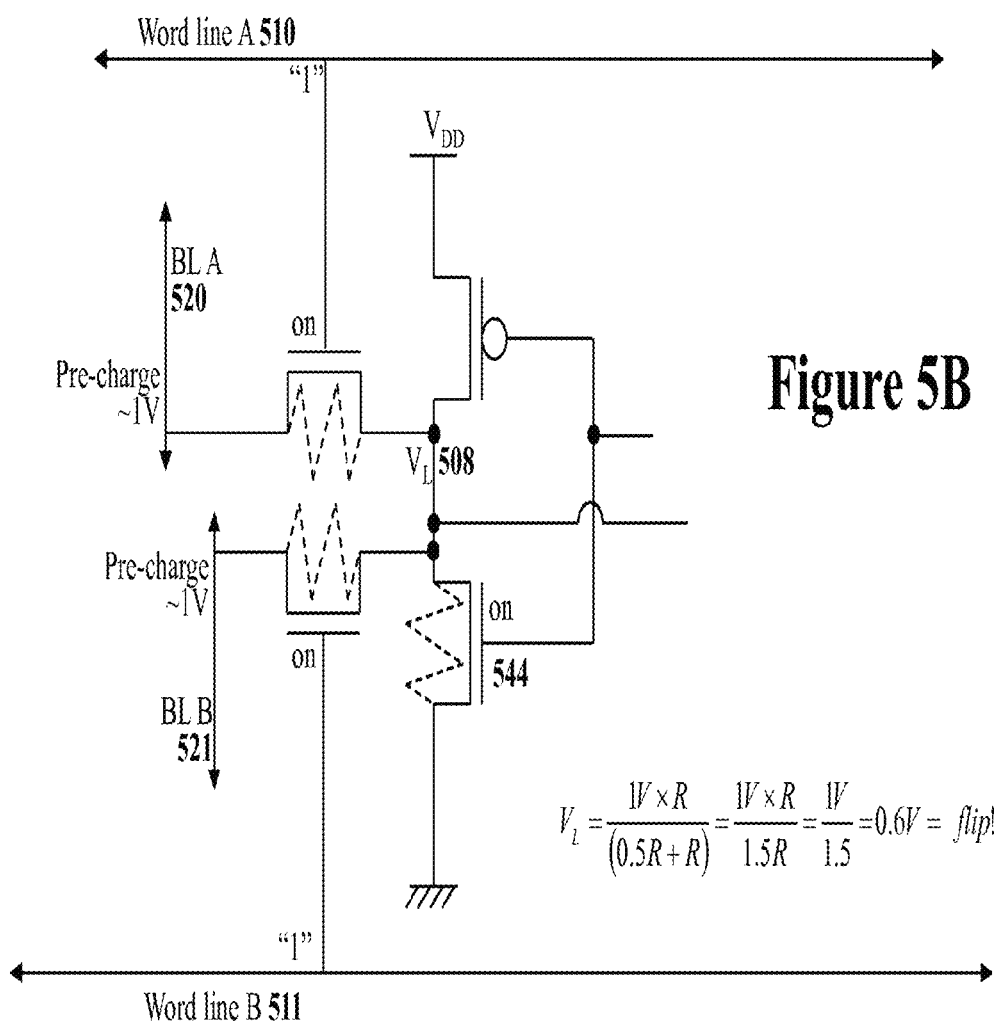
FIG. 5B illustrates a difficult situation that may occur when reading from a dual-port 8T SRAM bit cell of FIG. 5A.

In addition to the added memory cell elements, the NMOS transistors used to implement the inverters within SRAM cell may need to be made even larger to prevent the loss of data during a read operation. For example, FIG. 5B illustrates a circuit diagram of half of a dual-port 8T SRAM cell wherein two entities are attempting to read the SRAM cell by accessing both ports into the SRAM cell simultaneously. If all of the NMOS transistors are the same size and both lines pre-charged then the voltage at data node $V_L$ 508 of the memory cell may be driven to 0.6 times the pre-charge voltage level. Thus, this concurrent read scenario presents a significant risk of unintentionally changing the data value in the memory cell during a read operation. To prevent this significant risk of changing the stored data bit value, inverter NMOS transistor 544 is typically designed to be significantly larger than the port NMOS transistors 531 and 533 to reduce the resistance across inverter transistor 544 thereby reducing the voltage at data node $V_L$ 508. The transistor size ratio is the key statistic used.

Note that the transistor size ratio of (inverter NMOS transistor 544)/(port transistors 531 or 533) must continue to grow with the number of additional ports added to the SRAM cell. Thus, in the dual-port 8T SRAM cell of FIG. 5A the inverter NMOS transistor 544 must be larger than the inverter NMOS transistor 344 in the single port SRAM cell of FIG. 3A. Similarly, with a three-port 10T SRAM cell (not shown), the inverter transistor will be even larger than the inverter transistor 544 in the dual-port 8T SRAM cell of FIG. 5A. The inverter transistor size may grow proportionally. For example, if the transistors size ratio used in a single port 6T SRAM cell of is (inverter transistor 344)/(port transistor 231) is selected to be 1.5 then in the dual-port 8T SRAM cell the ratio may be (1.5*2)=3 and in a three-port 10T SRAM cell the ratio may be (1.5*3)=4.5. This ratio continues to grow thus making SRAM cells with larger numbers of ports very large and cumbersome.

Due the additional circuit elements needed (bit lines, port transistors, and a word line) and the need for a larger NMOS transistor in the inverter, the dual-port 8T SRAM cell of FIG. 5A is typically significantly larger than the 6T SRAM cell of FIG. 2A. Thus, the memory density (memory data bits per unit area) for a memory system made up of an array of dual-port 8T SRAM cells will be significantly lower than the memory density of memory system made up of an array of single-port 6T SRAM cells. It would therefore be desirable to find other ways of designing dual-port SRAM bit cells.

2 Reads with 6T Dual-Port SRAM with Split Word Line

Referring back to FIG. 2A, the basic 6T SRAM cell has two port transistors 231 and 232 with two associated complementary bit lines 220 and 225. There are two main reasons that two complementary bit lines are used within the standard 6T SRAM cell: (1) the ability to effectively and reliably write data into the memory cell; and (2) read access speed.

The critical reason for having two complementary bit lines is that it is very difficult if not impossible to write a "1" data value into a standard 6T SRAM bit cell from only one side of the 6T SRAM cell. Recall that in FIG. 3B the inverter NMOS transistor 344 was constructed much larger than the port NMOS transistor 331 in order to prevent the pre-charge voltage of a read operation from destroying a stored "0" data value when a read operation is performed. For the very same reason that the larger inverter NMOS transistor 344 was needed, that larger inverter NMOS transistor 344 makes it difficult to write a logical "1" value to the memory bit cell. Specifically, the positive voltage (–1V in the example of FIG. 3B) placed onto bit line 320 when writing a logical "1" passes through port NMOS transistor 331 and inverter NMOS transistor 344 that together act as a voltage divider. Since inverter NMOS transistor 344 is much larger than port NMOS transistor 331 (and thus has lower resistance), the voltage at point $V_L$ 308 will often not be high enough to effectively write a logical "1" into the memory cell.

In order to effectively and reliably write a new logical "1" data value into a standard 6T SRAM cell, the complementary bit line 325 is generally required. Referring back to FIG. 3B, if a positive voltage (logical "1") is placed on bit line 320 during a write operation then a complementary zero voltage value (logical "0") will be placed on the complementary bit line 325 during the write operation. The zero voltage (logical "0") on the complementary bit line 325 will propagate through port transistor 332 to cause a zero voltage value at point $V_R$ 309 that controls PMOS transistor 343 and NMOS transistor 344. The zero voltage value at point $V_R$ 309 turns on PMOS transistor 343 and turns off NMOS transistor 344 thus increasing the voltage at point $V_L$ 308 to $V_{DD}$ thereby writing a logical "1" into the memory cell. Thus, the writing of a logical "0" into one side of a memory bit cell causes the other side of the memory bit cell to become a logical "1" using the inverter of the memory bit cell.

The net effect of this phenomenon is that with a standard 6T SRAM bit cell, only a logical "0" can be written into the memory bit cell. However, since there is both a data/true side of a memory bit cell and a data-complement/false side of the memory cell, a logical "1" may be written into the memory bit cell by writing a logical "0" into the data-complement/false side of the memory bit cell that will cause the inverter to drive data/true side of the memory cell to become a logical "1".

As noted above, read access speed is a second reason that complementary bit lines are used in a standard 6T SRAM cell. It is possible to read the data state of a memory bit cell by reading from only one side of the memory bit cell. For example, referring to FIG. 3A, a memory reading circuit could turn on word line 310 and only sample the data/true side of the standard 6T SRAM cell to obtain the stored data bit. However, by accessing both sides (308 and 309) of the memory cell concurrently, a differential amplifier coupled to the pair of complementary bit lines (320 and 325) can read the state of the memory bit cell faster than by reading from a single end of the memory cell. Thus, traditional 6T SRAM cells generally perform read operations by simultaneously reading from both sides (308 and 309) of the SRAM bit cell.

Figure 6A:
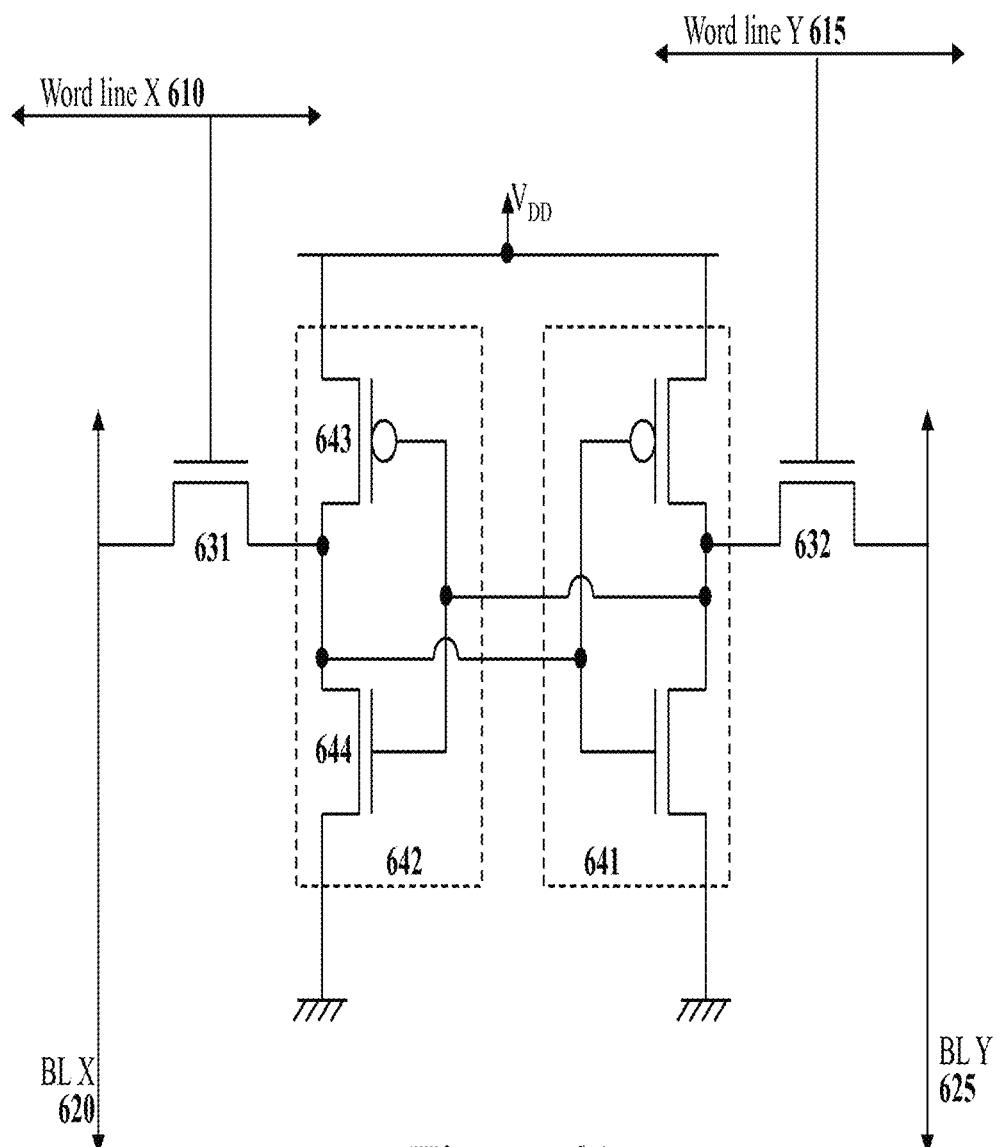
FIG. 6A illustrates a proposed dual-port six transistor (6T) SRAM bit cell.
Figure 6B:
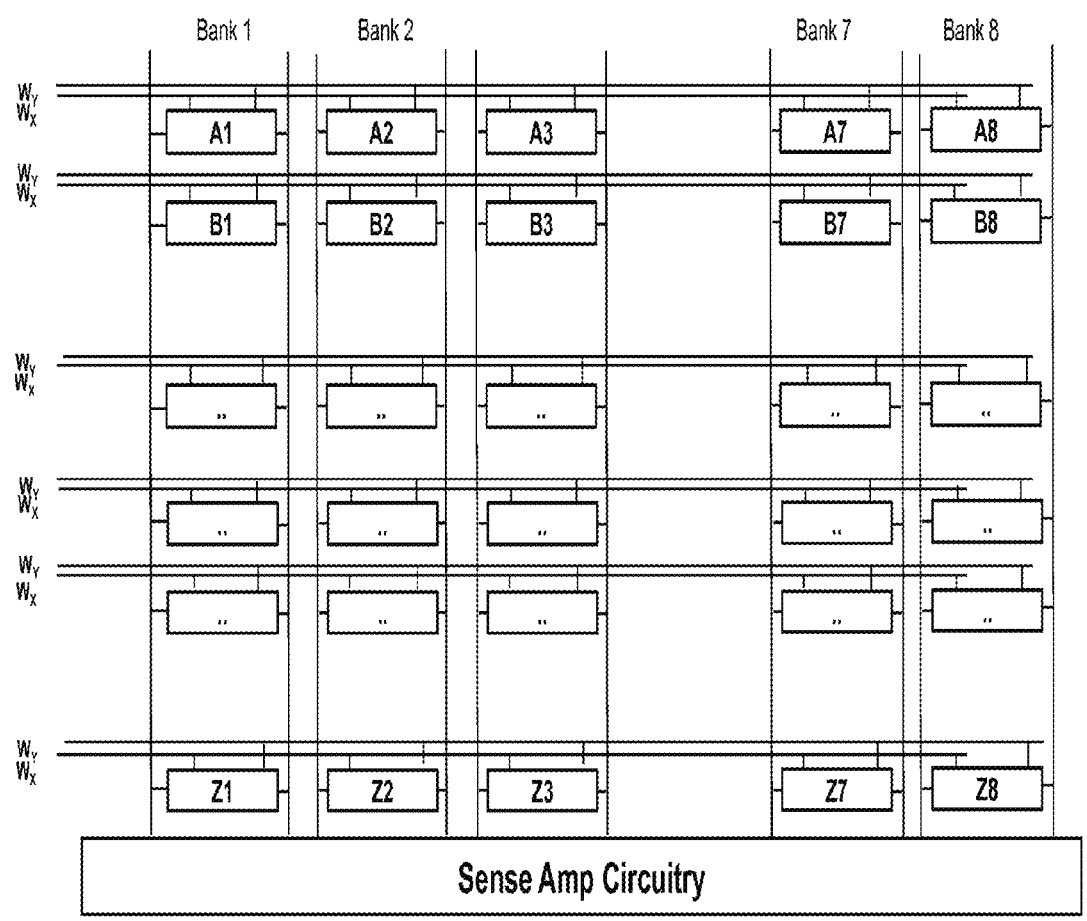
FIG. 6B illustrates a block diagram of a memory array constructed with the dual-port 6T SRAM bit cell of FIG. 6A.

If an integrated circuit designer is willing to accept a slower read operation speed for a particular application, then the traditional 6T SRAM cell may be modified to create a one write port or two read port SRAM bit cell. FIG. 6A illustrates one embodiment of a one write port or two read port (1W or 2R) 6T SRAM bit cell. In the 1W or 2R memory cell of FIG. 6A, there are two independently controllable word lines (word line X 610 and word line Y 615) that each control associated port transistors (631 and 632) located on opposite sides of the memory cell. FIG. 6B illustrates a high level block diagram of a memory array containing an array of the split-word line 1W or 2R memory cells of FIG. 6A. Not that each row of the memory array has both an X word line and Y word line that each independently control one of the two bit lines.

Write operations into the 1W or 2R memory cell of FIG. 6A may be handled in the same manner as a traditional 6T SRAM cell. Specifically, to perform a write operation, the write circuitry (not shown) asserts both word line X 610 and word line Y 615 simultaneously for the same row to simultaneously activate the both port transistors 631 and 632, respectively. The write circuitry also drives bit line X 620 and bit line Y 625 as traditional complementary data bit lines where bit line X 620 asserts the data bit and bit line Y 625 asserts the complement of the data bit. FIG. 7 illustrates a timing diagram with middle portion illustrating a single write per clock cycle being performed.

To perform two concurrent read operations into the 1W or 2R memory cell of FIG. 6A, word line X 610 and word line Y 615 are operated independently for the two different concurrent read operations. Word line X 610 is asserted in one row for a first read operation using bit line X 620 and word line Y 615 is asserted (in different row or the same row of the same memory array) for a second concurrent read operation using bit line Y 625 (in another column or the same column of the array). Note that the read operation performed using word line Y 615 and bit line Y 625 will be read from the data-complement/false side of a memory cell such that the read data bit must be inverted for the true data bit value. The bottom portion of FIG. 7 illustrates a timing diagram of two concurrent read operations being handled in a single clock cycle by concurrently using the two different word lines (and associated bit lines) for the two independent read operations.

The physical construction of the 1W or 2R memory cell of FIG. 6A is very similar to the traditional single port 6T SRAM cell of FIG. 2C except that the 1W or 2R memory cell of FIG. 6A requires two independent word lines (word line X 610 and word line Y 615) routed to each SRAM cell. This can be managed by using the standard techniques for routing the two word lines used in the dual-port 8T SRAM cell of FIG. 5A with the smaller single port 6T SRAM cell of FIG. 2C. The resulting 1W or 2R memory cell of FIG. 6A will be significantly smaller than the dual-port 8T SRAM cell of FIG. 5A since there is only one port transistor on each side of the memory cell and there is no need to make the inverter NMOS transistor much larger to prevent a concurrent read operation from accidentally changing the state of the SRAM bit cell.

In one particular embodiment, the size of the inverter's PMOS transistor 643 and the port transistor 631 are approximately the same size. However, the size of the inverter's NMOS transistor 644 is approximately 1.5 times as large as the port NMOS transistor 631 in order to prevent the pre-charge phase of read operations from destroying stored data bits as previously described with reference to FIGS. 3A and 3B.

The two concurrent but independent read operations performed with the memory system of FIGS. 6A and 6B use spatial division multiplexing (SDM) to accomplish the two independent concurrent read operations. Specifically, one area of the memory array space (word line X, bit line X, and a left port transistor) is used for the first read operation and a second area of the memory array space (word line Y, bit line Y, and the right port transistor) is used for the independent second read operation.

Improved Concurrent Reads with 6T Dual-Port SRAM with Split Word Line

The split word line memory system of FIGS. 6A and 6B allows for either one write operation (1W) or two concurrent read operations (2R) during each memory cycle. However, the "single-ended" read operations will not be as fast as normal differential read operations that require the use of two complementary bit lines. Specifically, the small SRAM bit cell lacks the power to quickly drive a single ended data value. To improve upon this situation, a "pseudo" differential read operation may be performed to increase the speed of a read operation.

Figure 6C:
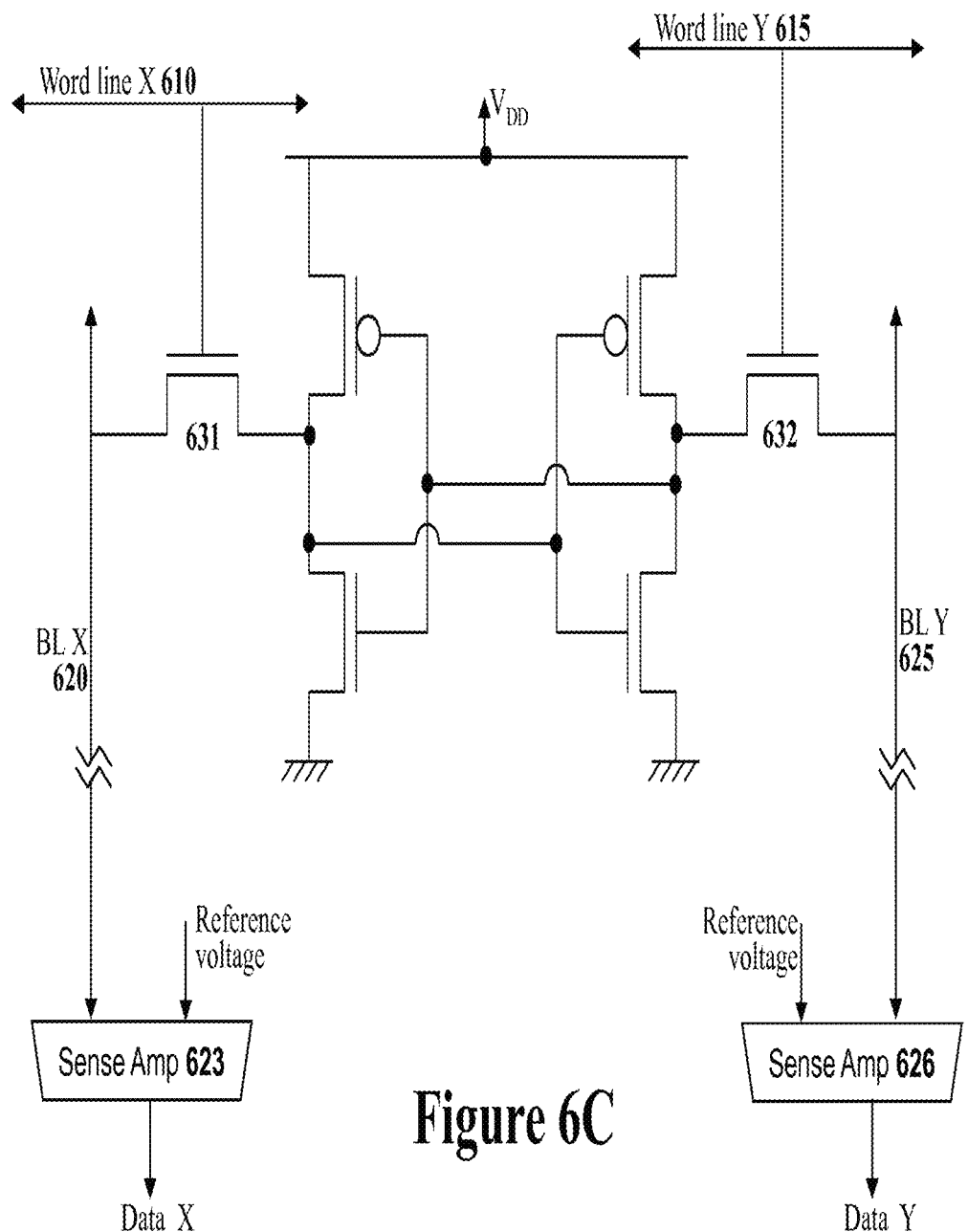
FIG. 6C illustrates a block diagram of the dual-port 6T SRAM bit cell of FIG. 6A coupled to sense amplifiers for performing pseudo differential read operations.

FIG. 6C illustrates an arrangement for performing a pseudo differential read operation. In FIG. 6C each bit line is coupled to a sense amplifier that also has a synthetically generated voltage reference value as an input. The synthetically generated voltage reference value is somewhere between the voltage value for a logical "1" and the voltage value for a logical "0". During a pseudo differential read operation, the output of a bit line is compared against the synthetically generated reference voltage value to output a data value faster than can be achieved with direct single-ended read operation.

As illustrated in the embodiment of 6B, the sense amplifiers may be situated at the bottom of a memory array. However, this configuration requires the memory cells to drive very long bit lines. Driving very long bit lines reduces the performance of the memory system due to the capacitance and resistance on the long data line. To improve upon this situation, the sense amplifier circuits may be implemented in the middle of the memory array as illustrated in the embodiment of FIG. 6D. The voltage reference generator circuits used for pseudo differential read operations may be placed at the edges of the memory array and provide voltage reference values along bit lines that are not being used. Note that the complementary bit line does not need to be used, any free bit line may be used to carry the voltage reference as long as that voltage reference is properly directed to the sense amplifier.

Two Writes Per Cycle (2W) with a 6T Dual-Port SRAM Cell

The previous two sections described how the traditional 6T SRAM cell of FIG. 6A may be modified with split word lines in order to implement a memory system that can handle two concurrent read operations in a single operating cycle. However, that split word line based memory system can still only handle a single write operation during each operating cycle since both bit lines (620 and 625) are required at the same time to perform a standard differential write operation.

The difficulty with write operations lies in the fact that it is very difficult if not impossible to write a logical "1" into either side of the memory bit cell using only a single-ended write operation. To remedy the difficulty of writing a logical "1" into a bit cell, a logical "0" is concurrently written into the other side of the memory bit cell such that an inverter in the memory bit cell then helps writes the logical "1" into the other side of the memory bit cell. To provide full dual-port memory functionality, it would be desirable to be able to read or write into a memory bit cell using only a single end of the memory bit cell.

Referring back to FIG. 3B, the difficulty in writing a logical "1" into a memory bit cell originates from the fact that the NMOS transistor 344 of the inverter in a memory cell is intentionally manufactured larger than the port NMOS transistor 331 in order to reduce the voltage at point $V_L$ 308 during the pre-charge phase of a read operation. Specifically, the larger NMOS transistor 344 has reduced resistance such that voltage drop across NMOS transistor 344 is smaller than the voltage drop across the port NMOS transistor 331 thereby preventing the pre-charge voltage from unintentionally writing a logical "1" into the memory bit cell during a read operation. Unfortunately, the reduced resistance of the NMOS transistor 344 also reduces the voltage at point $V_L$ 308 when an actual write operation attempts to write a logical "1" into a single side of the memory bit cell such that the write operation will fail unless there is a logical "0" concurrently written into the other side of the memory bit cell.

To remedy this situation that prevents single-ended writes of logical "1"s, it would be advantageous if the memory bit cell operated in a different manner during read operations and write operations. Specifically, the NMOS transistor 344 of the inverter should have a low resistance value during read operations in order to prevent pre-charges from overwriting stored data but the NMOS transistor 344 should have a higher resistance value during write operations that would allow logical "1" values to be easily written into a single side of the memory bit cell. Specifically, a higher resistance values during write operations would allow point $V_L$ 308 to achieve a higher voltage value when writing a logical "1" into the memory bit cell. The higher voltage at point $V_L$ 308 could then flip the other side of the memory cell to a logical "0" by using inverter 341 to flip the data value at point $V_R$ 309.

The NMOS transistor 344 in a memory bit cell is a field effect transistor (FET) that has two main operating states: a linear region and a saturation (or active mode) region. In a digital circuit, the saturation region is generally more important since that is where the circuit operates when it is fully "turned on". In the saturation region of operation, the electrical current from drain to source ($I_D$) can be modelled as:

$$I_D = \frac{\mu_n C_{ox}}{2} \frac{W}{L} (V_{GS} - V_T)^2$$

Where
$\mu_n$=charge-carrier mobility (constant)
$C_{ox}$=gate oxide capacitance per unit area (constant)
W=gate width (constant)
L=gate length (constant)
$V_{GS}$=Gate to source voltage (variable)
$V_T$=Threshold Voltage for operation (constant)

In preceding equation, almost all of the terms are fixed constants for a particular transistor once that transistor has been manufactured. However, one term in the equation that is not a fixed constant is the squared term containing the variable gate-to-source $V_{GS}$ voltage value. In fact the $(V_{GS}-V_T)^2$ term of the equation dominates the model due to the exponential component. Thus, if the gate to source voltage of the transistor is reduced, the current from drain to source ($I_D$) will also be reduced. Therefore, reducing the gate to source voltage ($V_{GS}$) of the transistor effectively increases the "resistance" of the field effect transistor.

By controlling the gate to source voltage ($V_{GS}$) of the inverter NMOS transistor in a memory bit cell, a memory bit cell circuit can be made to function differently during read operations than it functions during write operations. Specifically, by lowering the gate to source voltage ($V_{GS}$) of the transistor and thereby increasing its resistance, the voltage at the inverter NMOS transistor is increased such that a single-ended write of a logical "1" may be successfully performed. An illustration of a single-ended write of a logical "1" is set forth with reference to FIGS. 8A, 8B, and 8C.

Figure 8A:
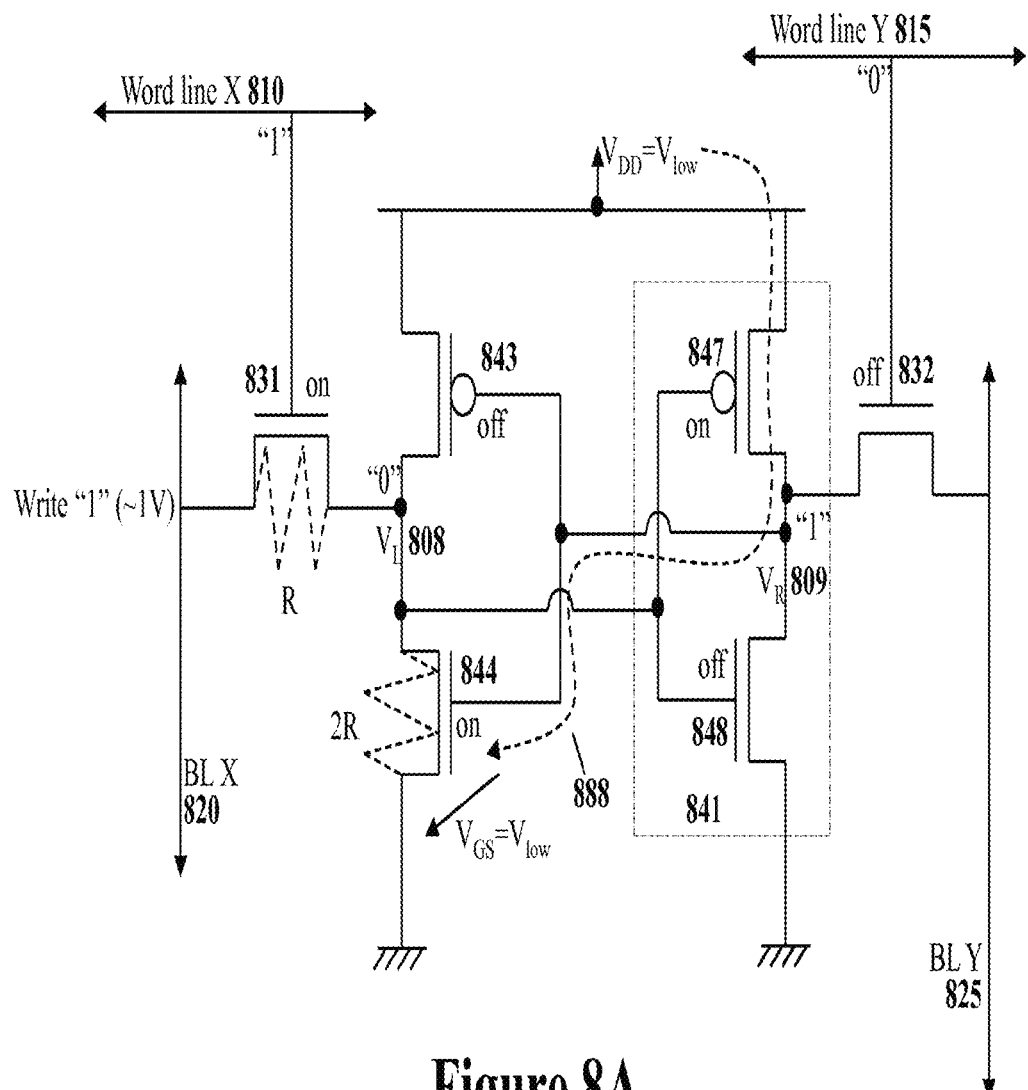
FIG. 8A illustrates a split word line 6T SRAM bit cell receiving a single-ended write operation of a logical "1" data bit.
Figure 8B:
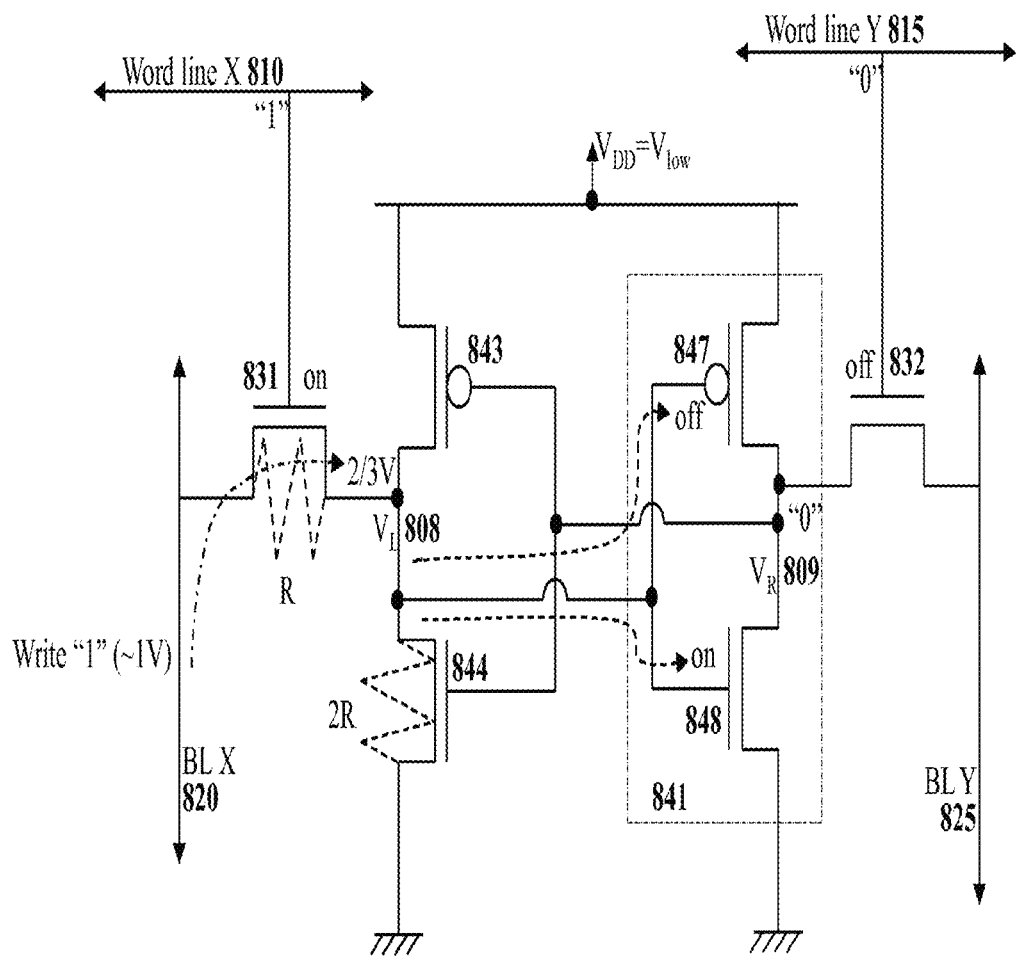
FIG. 8B illustrates the split word line 6T SRAM bit cell of FIG. 8A changing state in response to the write operation of a logical "1" data bit.
Figure 8C:
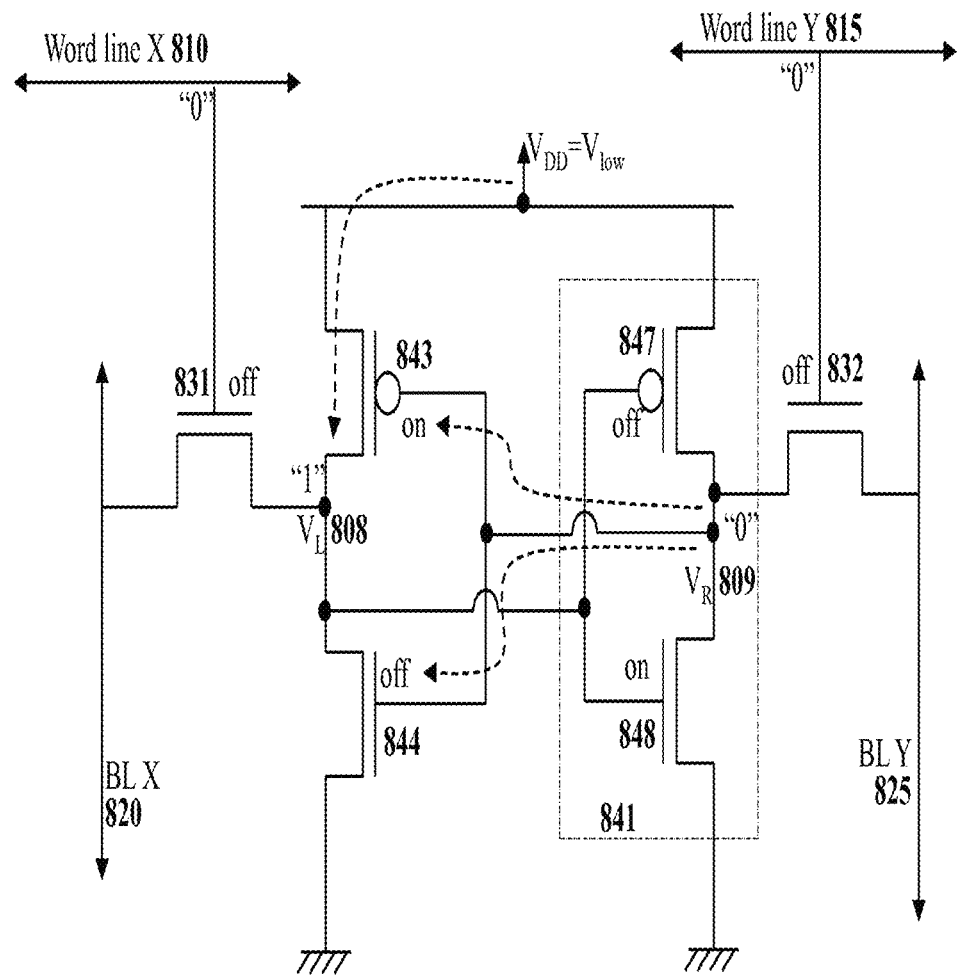
FIG. 8C illustrates a final state of the split word line 6T SRAM bit cell of FIG. 8B after the word line has been deactivated upon completing the write operation.

FIGS. 8A, 8B, and 8C illustrate an example of how controlling the gate-to-source voltage ($V_{GS}$) of an inverter transistor in memory bit cell may facilitate a single-ended write of logical "1" into a 6T SRAM cell. Referring to FIG. 8A, a memory bit cell currently stores a logical "0" data bit since the data/true side has a logical "0" (represented by ground) at point $V_L$ 808 and the data-complement/false side has a logical "1" (represented by a small positive voltage value such as IV) at point $V_R$ 809. The logical "0" (ground) stored on the data/true side at point $V_L$ 808 activates the PMOS transistor 847 coupled to $V_{DD}$ (and turns off NMOS transistor 848 coupled to ground) such that the voltage at the gate of NMOS transistor 844 is substantially equal to the $V_{DD}$ power voltage value as illustrated by signal pathway 888 illustrated in FIG. 8A.

By lowering the voltage of $V_{DD}$ value to a lower voltage value ($V_{low}$), the gate-to-source voltage ($V_{GS}$) of the inverter NMOS transistor 844 is reduced to $V_{low}$ such that the resistance across inverter NMOS transistor 844 should be increased. For illustration purposes, the resistance depicted as a value of 2R Ohms relative to the resistance value of R Ohms across the port NMOS transistor 831 that is activated with a normal activation voltage level. Note that an external circuit outside of the memory array provides the $V_{DD}$ voltage such that the $V_{DD}$ voltage can easily be controlled.

When a write operation of a logical "1" data bit is received while the $V_{DD}$ power voltage value is held at the lower voltage value ($V_{low}$) (as illustrated in FIG. 8A) then the memory cell circuit can handle a single-ended write of the logical "1" data bit. Specifically, a logical "1" data bit (represented by ~1 Volt in this example) is driven on bit line X 820 and the word line X 810 is asserted with a full normal voltage value to turn on port NMOS transistor 831 into the memory bit cell. Note that the normal voltage value asserted on word line X 810 is higher than the $V_{low}$ value such that the resistance across port NMOS transistor 831 will be lower than the resistance across resistance across inverter NMOS transistor 844.

Referring now to FIG. 8B, the logical "1" data bit asserted on bit line X 820 passes through port NMOS transistor 831 (with a small voltage drop) to the data/true side of the memory bit cell at point $V_L$ 808. From point $V_L$ 808, the logical "1" data value being written also passes through inverter NMOS transistor 844 to ground initially since the gate to source voltage ($V_{GS}$) of the inverter NMOS transistor 844 is originally controlled by the logical "1" state that was stored at point $V_R$ 809. However, since the $V_{DD}$ power voltage is a low voltage value ($V_{low}$) the low gate-to-source voltage ($V_{GS}$) of the inverter NMOS transistor 844 causes the resistance of inverter NMOS transistor 844 to be higher relative to the resistance of transistor 831. Thus, the voltage placed at the data/true side of the memory bit cell at point $V_L$ 808 is ⅔V due to the voltage divider circuit formed by port NMOS transistor 831 (lower resistance) and inverter NMOS transistor 844 (higher resistance).

The ⅔V value at point $V_L$ 808 is high enough to flip the state of the memory cell since it is high enough to activate inverter 841. Specifically, as illustrated in FIG. 8B, the ⅔V value at point $V_L$ 808 turns off PMOS transistor 847 and turns on NMOS transistor 848 such that point $V_R$ 809 is pulled down to a logical "0" (ground). At this point, the data state of the memory cell has been changed such that true/ data side now has a logical "1" (currently represented by ⅔V) and the false/data-complement side now has a logical "0" (represented by ground). Note that to ensure inverter 841 is activated, the circuit geometry of inverter 841 may be adjusted to slide the transfer function of FIG. 4 to the left.

FIG. 8C illustrates a final state that is achieved after the logical "1" write operation after word line X 810 is no longer asserted such that port transistor 831 is turned off. As illustrated in FIG. 8C, the logical "0" at point $V_R$ 809 then turns on PMOS transistor 843 and turns off NMOS transistor 844 such that point $V_L$ 808 is driven to a logical "1" (now represented by a $V_{DD}$ voltage level). The $V_{DD}$ voltage level may be changed by an external circuit to a higher voltage level such as the voltage level that is used to drive the word lines (810 and 815).

FIG. 9A illustrates a first timing diagram that illustrates how a split word line 6T SRAM cell with a variable $V_{DD}$ power voltage level may be used to perform either two write operations or two read operations in a single clock cycle. The upper portion of FIG. 9A illustrates how two concurrent write operations may be performed. A first write operation uses word line X and bit line X and a concurrent second write operation uses word line Y and bit line Y. To ensure the success of the two single-ended write operations, the memory control system lowers the $V_{DD}$ power voltage provided to the memory array. Alternatively, the memory control system may just lower the $V_{DD}$ power voltage provided to the specific rows of the memory array that are being read.

The lower portion of FIG. 9A illustrates how two single-ended read operations may be performed. Note that the $V_{DD}$ power voltage should be driven to the normal level during the read operations such that the pre-charge phase of the read operation does not accidentally over-write data.

As set forth in the preceding paragraphs referencing FIGS. 8A, 8B, and 8C, a single-ended write of a logical "1" data bit can be performed by reducing the $V_{DD}$ power voltage provided to a 6T SRAM bit cell when the write operation is performed. Thus, reducing the $V_{DD}$ power voltage allows for two concurrent single-ended write operations to be performed as illustrated in the timing diagram of FIG. 9A. However, there are several other benefits to reducing the $V_{DD}$ power voltage to a lower voltage level ($V_{low}$) in a SRAM bit cell array. By providing a lower $V_{DD}$ power voltage to the memory array, the memory array will consume less power. Furthermore, there will be less leakage current since the amount of leakage current is exponentially proportional to the voltage level. The reduced power consumption will also mean that less heat will be generated by the memory array. In integrated circuits that have heat dissipation issues, it would be beneficial to have a memory array that produces less heat.

Since there are several other benefits of reducing the $V_{DD}$ power voltage level for a memory array then instead of lowering the $V_{DD}$ power voltage when a write operation occurs, one may instead opt to raise the $V_{DD}$ power voltage level only when read operations occur. Specifically, the present disclosure proposes a memory system that is powered with the $V_{DD}$ power voltage at a reduced voltage level for most of the time and across most of the memory. The $V_{DD}$ voltage level provided to the memory array is reduced relative to the voltage level used to activate the word lines in the array. However, when a read operation occurs, the memory control circuitry then raises the $V_{DD}$ voltage to a level that ensures the pre-charge operation does not accidentally over-write the currently stored data value in a memory cell. In this manner the memory array has the advantages of reduced power usage along with the ability to perform both single-ended reads and writes.

FIG. 9B illustrates a timing diagram that illustrates how a split word line 6T SRAM array with a variable $V_{DD}$ power voltage level may be used to perform either two concurrent write operations or two concurrent read operations in a single clock cycle. The memory array for the system of FIG. 9B is generally provided with a reduced $V_{DD}$ voltage for most of the array and most of the time. (The $V_{DD}$ voltage level is reduced relative to the voltage level placed on word lines to activate port transistors.) The reduced $V_{DD}$ voltage allows the memory array to handle two concurrent single-ended write operations as illustrated by the upper portion of FIG. 9B. However, the reduced $V_{DD}$ power voltage could potentially cause the pre-charge during a read operation to over-write stored data. Thus, the memory system raises the $V_{DD}$ power voltage when performing read operations as illustrated in the lower portion of FIG. 9B. The $V_{DD}$ power voltage may be raised for the entire memory array during the read operations. However, a more efficient implementation will only raise the $V_{DD}$ power voltage provided to the specific memory rows that are currently being read.

One Read and One Write Concurrently

The previous sections described how the 6T SRAM cell of FIG. 6A can be used to implement a memory system that handles two concurrent read operations or two concurrent write operations in a single operating cycle. Thus, a 2R or 2W memory system may be created using the teachings of the previous sections. However, a true dual-port memory system should be able to handle two concurrent read operations (2R), two concurrent write operations (2W), or one read operation and one concurrent write operation (1W and 1R) in a single cycle.

At first glance, it would seem easy to add the ability to perform one independent read operation and one independent write operation (1W and 1R) in a single cycle. For example, word line X 610 and bit line X 620 could be used for a read operation and word line Y 615 and bit line Y 625 could be concurrently used for a write operation. This will indeed work if the read and write operations access memory cells in rows far away from each other. But if the read and write operations access the same row of memory cells then the two operations cannot be performed concurrently. Specifically, the write operation uses a low $V_{DD}$ power voltage while the read operation uses a high $V_{DD}$ power voltage and since the memory cells in the same row are served by the same $V_{DD}$ power line, the concurrent read and write operations that use two different $V_{DD}$ power voltage levels cannot be handled concurrently.

The situation for concurrent read and write operations is actually even more difficult than that. FIG. 10 illustrates a conceptual block diagram for a five cell (horizontally) by six cell (vertically) subsection of a memory array that uses split word lines. In the memory array subsection of FIG. 10, each memory cell row is served by a pair of horizontal word lines ($W_x$ and $W_y$) and each memory cell column is served by a pair of associated bit lines ($BL_x$ and $BL_y$). However, although each row has independent word lines ($W_x$ and $W_y$), each row of memory cells in FIG. 10 shares a common $V_{DD}$ power voltage line with an adjacent row of memory cells. For example, all of the memory cells in row 0 share a common $V_{DD}$ power voltage line will all of the memory cells in row 1. Similarly, all of the memory cells in row 2 share a common $V_{DD}$ power voltage line will all of the memory cells in row 3. This arrangement is created by laying out mirror image memory cells extending from the common $V_{DD}$ power voltage line. Using a common $V_{DD}$ power voltage line maximizes the memory array density by reducing the number of $V_{DD}$ power voltage lines by one half. However, this layout area efficient arrangement complicates a memory system that operates by dynamically adjusting the voltage level on the VDD power voltage line. Specifically, if a memory write operation and a memory read operation attempt to access the same memory row or adjacent memory rows that share a common $V_{DD}$ power voltage line, then these two operations cannot be performed concurrently.

Figure 11:
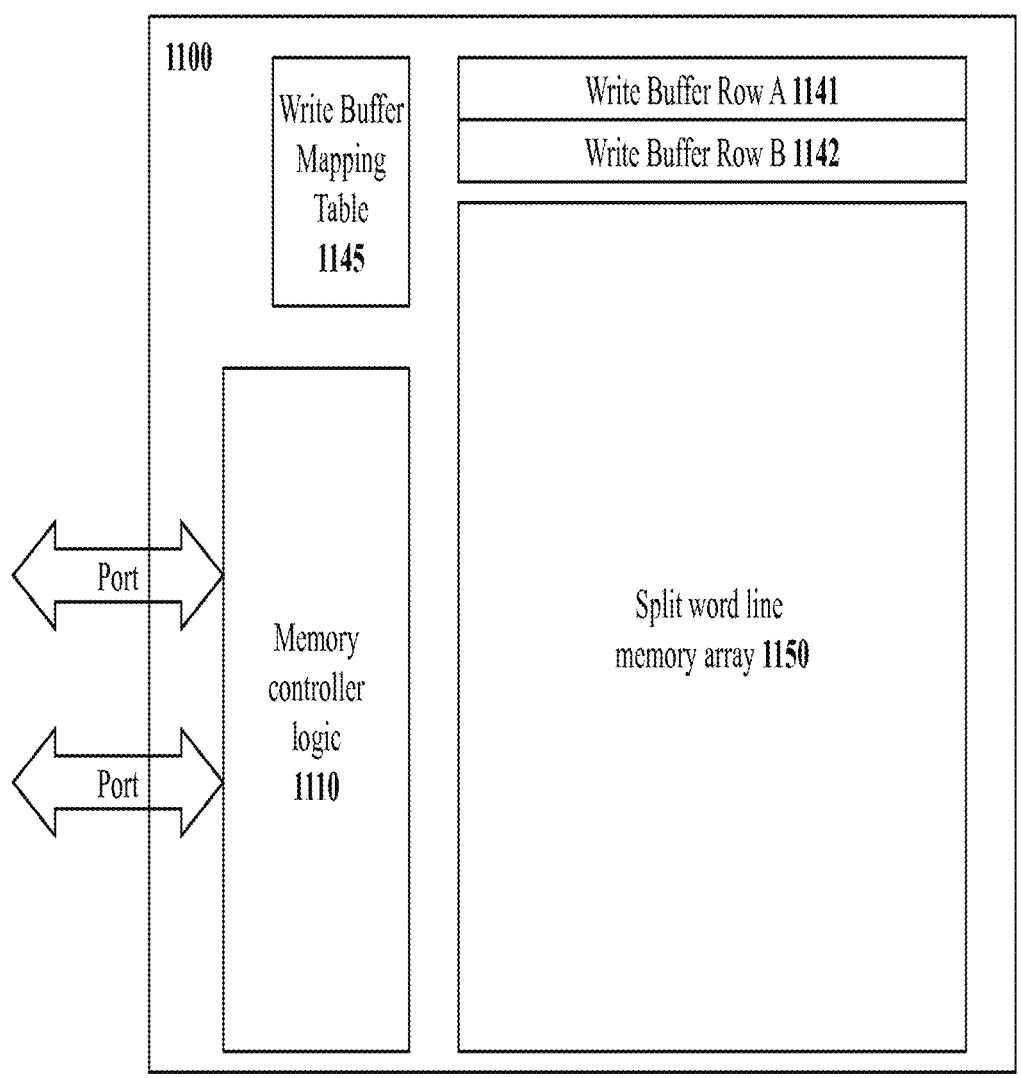
FIG. 11 illustrates a block diagram of a memory system that includes a write buffer such that the memory system can handle a concurrent write operation and read operation (1W and 1R) in a single cycle.

To resolve this situation wherein read operations and write operations conflict with each other, a write buffer may be added to the memory system in order to handle conflicts. FIG. 11 illustrates a block diagram of a memory system 1100 that includes two write buffer rows 1141 and 1142 such that memory system 1100 can handle two concurrent read operations (2R), two concurrent write operations (2W), or one read operation and one concurrent write operation (1W and IR) in a single cycle.

The write buffer rows 1141 and 1142 are the same width as the rows in the main memory array 1150 and each column entry is associated with the matching column in the main memory array 1150. When there is a conflict between a read operation and write operation that attempt to access rows served by the same $V_{DD}$ power voltage line then the read operation is given priority to access the memory array 1150 and the write operation stores the write data into the associated column entry of one of the write buffer rows 1141 or 1142. A write buffer mapping table 1145 is used to keep track of which data rows currently have valid data stored in the write buffer. A full description of the operation of the memory system 1100 is presented with reference to the flow diagrams illustrated in FIGS. 12A and 12B.

The write buffer rows 1141 and 1142 and the write buffer mapping table 1145 may be implemented in a variety of different manners. For example, these memory structures may be created with physical memory circuit arrays. Alternatively, these structures may be implemented with register-transfer level (RTL) code in a hardware design language (HDL) such that the actual memory circuits are synthesized with flip-flops or other memory circuits when the RTL code is processed by a synthesis tool.

Figure 12A:
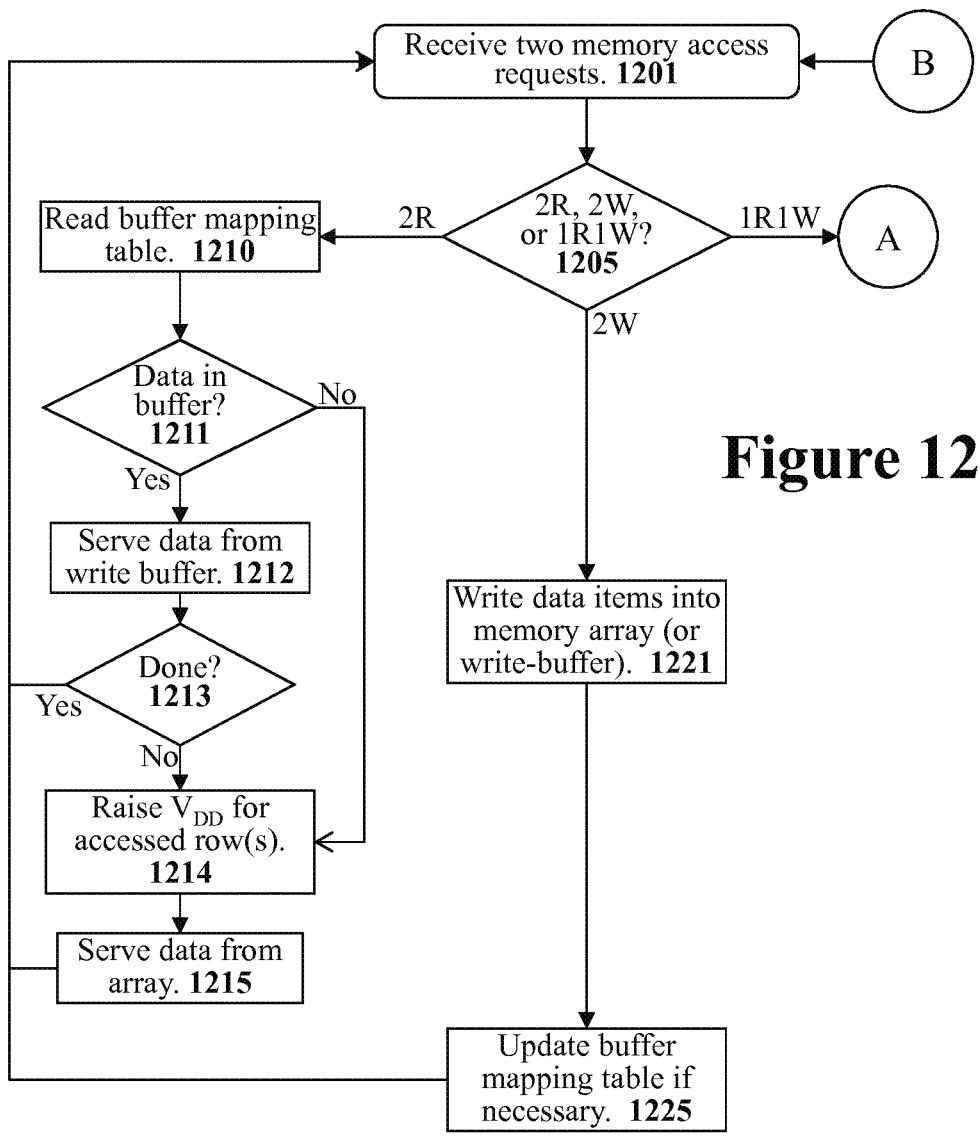
FIG. 12A illustrates a flow diagram that describes how the memory system of FIG. 11 may handle two concurrent write operations or two concurrent read operations.
Figure 12B:
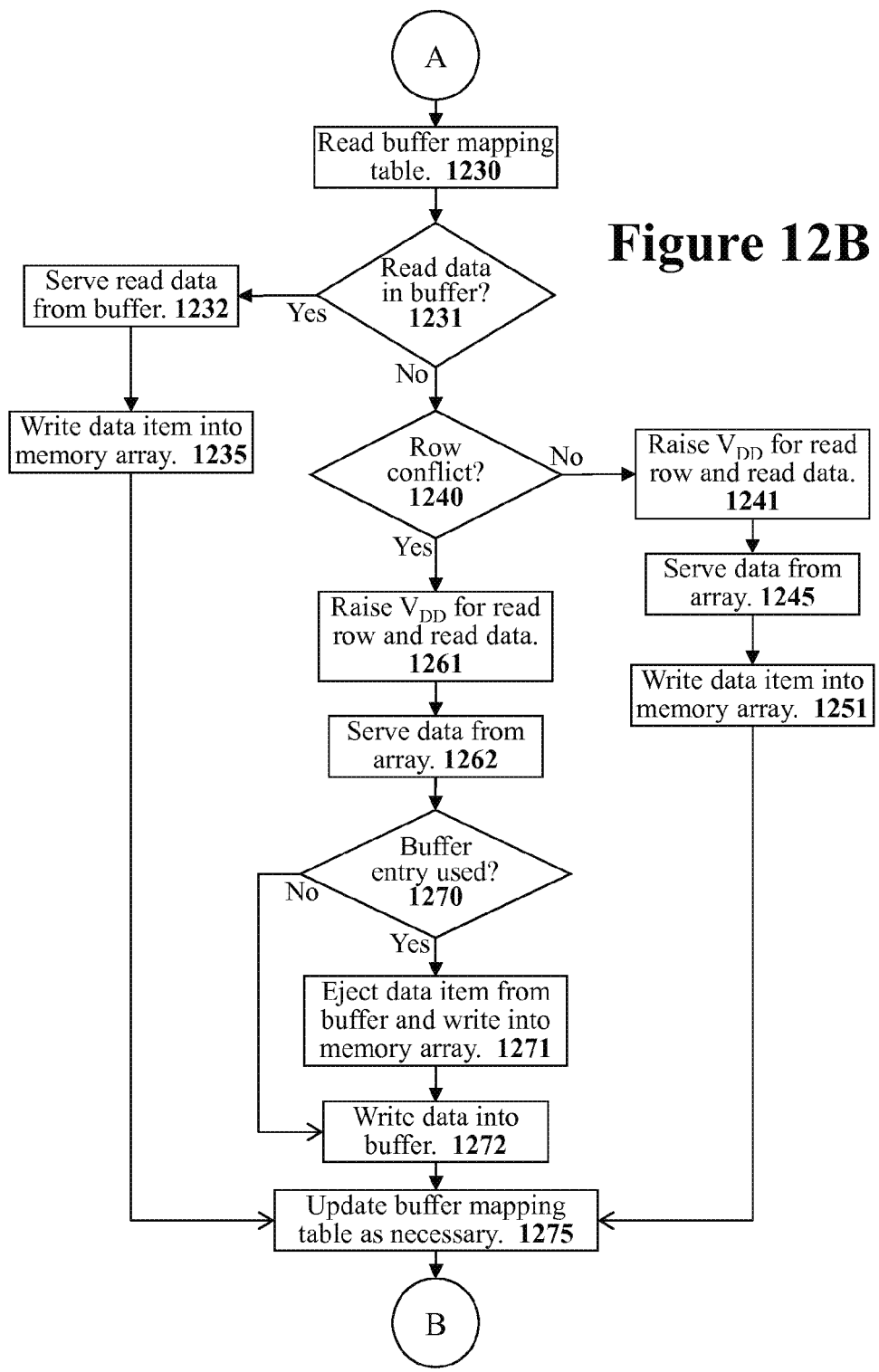
FIG. 12B illustrates a flow diagram that describes how the memory system of FIG. 11 may handle concurrent read and write operations without concurrently accessing the same row of a memory array.

The flow diagrams of FIGS. 12A and 12B conceptually illustrate the operation of the memory system 1100 of FIG. 11. Note that various operations are illustrated sequentially in FIGS. 12A and 12B for clarity but many of these stages may be performed in parallel. Referring to the top of FIG. 12A, the memory system receives two memory access operations at stage 1201 that may be two concurrent read operations (2R), two concurrent write operations (2W), or one read operation and one concurrent write operation (1W and 1R) in a single cycle. At stage 1205 the memory system determines how to proceed depending upon what type of memory operations were received.

If two write operations (2W) were received, the system proceeds to stage 1221 where the two data values are written into the memory array 1150 of the memory system 1100. There is no conflict since the memory array 1150 can handle two concurrent memory write operations to any two locations within the memory array 1150 as set forth with reference to FIGS. 9A and 9B. However, in some embodiments a write buffer may be used to handle one write operation if the write operations are directed to the same row in order to improve memory system performance as will be described in a later section of this document.

After writing the two data values the memory controller 1110 may update the write buffer mapping table 1145 at stage 1225 if necessary. For example, if the memory system wrote a data value into the memory array 1150 that was previously represented in one of the write buffer rows 1141 or 1142 then the memory controller 1110 updates the write buffer mapping table 1145 to indicate that the valid data is now stored within the memory array 1150. The system then returns back to stage 1201 to handle the next pair of memory access requests.

Referring back to stage 1205, if two read operations (2R) were received, the system proceeds to stages 1210 and 1211 where the memory controller 1110 reads the write buffer mapping table 1145 and determines where the requested data is located. If one or both of the requested data items are reside within the write buffer rows 1141 or 1142 then the system proceeds to stage 1212 where the requested data is served from the write buffer. At stage 1213, the memory system determines if both data items were served from the write buffer and if both items were served from the write buffer then the memory controller may return back to stage 1201 to handle the next pair of memory access requests.

If stage 1211 determined that neither requested data item was in the write buffer or stage 1213 determined that only one data item was served from the write buffer then the system proceeds to stage 1214 to handle the remaining data requests. At stage 1214, the memory controller 1110 raises the $V_{DD}$ power voltage line for the row or rows in the memory array 1150 that contain the remaining data. The memory system then serves the remaining data from the memory array 1150 at stage 1215 and then returns back to stage 1201 to handle the next pair of memory access requests.

Referring back to stage 1205, if a read operation (1 R) and a write operation (1W) were received, then the system proceeds to stage 1230 on FIG. 12B to handle the concurrent memory read and write memory requests. At stage 1230, the memory controller 1110 reads the write buffer mapping table 1145 to determine where the data requested in the read operation is located. If stage 1231 determines that the requested data item resides within one of the write buffer rows 1141 or 1142 then the system proceeds to stage 1232 where the requested data item is served from the write buffer. The memory system can then handle the write operation at stage 1235 by writing the data into the memory array 1150. Finally, the memory controller 1110 may update the write buffer mapping table 1145 at stage 1275 if the data written into the memory array 1150 at stage 1235 was previously represented in the write buffer by invalidating that entry in the write buffer. Note that in a real system, the read from the write buffer and the write into the memory array 1150 will be performed in parallel. The memory system then returns back to stage 1201 to handle the next pair of memory access requests.

Referring back to stage 1231, if the data being read was not in the write buffer then the memory system determines if there is a row conflict between the read operation and the write operation at stage 1240. There is a row conflict if the read operation and the write operation access data cells that are served by the same $V_{DD}$ power voltage line. As illustrated in FIG. 10, this may occur when the two data cells are located in the same row or in adjacent rows that share the same $V_{DD}$ power voltage line.

If stage 1240 determines that there is no row conflict then the memory system may proceed to stage 1241 to handle the non-conflicting read and write operations. The system handles the read operation by raising the $V_{DD}$ power voltage line for the row containing the read data at stage 1241 and serving the data from that row in the memory array 1150 at stage 1245. The system handles the write operation by writing the write data into the memory array 1150. The memory system may need to update the write buffer mapping table 1145 at stage 1275 if the data written into the memory array 1150 was previously represented in the write buffer by invalidating the entry in the write buffer. Note that in an implemented memory system, the non-conflicting read from and the write into the memory array may be performed in concurrently. The system may then return back to stage 1201 to handle the next two memory access requests.

Referring back stage 1240, if there is a conflict between the read operation and the write operation then the memory controller must use the write buffer to handle the conflicting operations. The read operation is given priority such that the memory controller 1110 raises the $V_{DD}$ power voltage line for the row containing the read data at stage 1261 and serves the requested data from that row in the memory array 1150 at stage 1262. The conflicting write operation must then be handled using the write buffer in the memory system.

To handle the conflicting write operation, the memory controller 1110 first determines if the associated data entry in the write buffer already stores other valid data at stage 1270. If other valid data is already stored in the write buffer then that data is ejected from the write buffer and written into the memory array 1150 at stage 1271. Then, if the write buffer entry was not already used or after the current data entry was ejected at stage 1271, the memory system can write the new data into the write buffer at stage 1272. Finally, at stage 1275, the memory controller updates the write buffer mapping table 1145 as required. If the write operation wrote into an empty data entry or replaced an ejected data entry then the memory controller updates the write buffer mapping table 1145 to reflect the new data stored into the write buffer. If write operation over-wrote the previously valid data for the same address then no update of the write buffer mapping table 1145 may be required.

As set forth in the preceding paragraphs, a combination of various different techniques allows a 6T SRAM bit cell to be used to implement a full dual-port memory system. First, a split word line allows the two different sides of a 6T SRAM bit cell to be accessed independently. This allows two concurrent independent read operations to be performed. A pseudo-differential read system may be used to improve the speed of single-ended read operations.

Second, control of the VDD power voltage line for a memory cell enables single-ended write operations to write either logical "0"s or logical "1"s into either side of a 6T SRAM bit cell. Specifically, reducing the voltage level on the $V_{DD}$ power voltage line relative to the voltage level placed on the word line allows for single-ended writes of logical "1"s that were previously not possible. Thus, the technique of reducing the voltage level on the $V_{DD}$ power voltage line allows two concurrent independent write operations to be performed.

And third, the addition of a write buffer into a memory system allows for one read and one write operation to be handled concurrently by resolving any possible conflict between the read operation and the write operation. As set forth in the previous paragraph, reducing the voltage level on the $V_{DD}$ power voltage line is required to allow a single-ended write of a logical "1" into a SRAM bit cell. However, reducing the voltage level on the $V_{DD}$ power voltage line prevents a concurrent read operation from any memory cells served by the same $V_{DD}$ power voltage line since the reads may accidentally destroy data. To resolve such conflicting read and write operations, the read operation is given priority to access the memory array whereas the write operation writes into a write buffer if there is a conflict.

Write Buffer Usage in Other Dual-Port Memory Systems

The previous section described how a write buffer may be used to implement a fully functional dual-port memory system that is constructed from 6T SRAM bit cells that have individually controllable word lines. However, a write buffer may also be used to improve the operation of existing dual-port memory systems.

FIG. 5A illustrates an 8T SRAM bit cell that may be used in a conventional dual-port memory system. When there are two different memory operations that access the same row of a memory array, those two different operations can interfere with each other to reduce performance. For example, if a read operation is using word line A 510, bit line A 520, and bit line A-complement 525 to read a data value from the memory bit cell then a concurrent write operation directed at a different memory cell in the same row may impede the read operation. Specifically, a concurrent write operation to a different cell in the same row will activate word line B 511 that will turn on port transistors 533 and 534. Thus, activating word line B 511 couples bit line B 521 and bit line B complement 526 to the memory cell such that the line capacitance of the SRAM bit cell is greatly increased. The increased line capacitance will increase the amount of time needed to read the data bit from the memory cell such that a concurrent write operation to the same row (but in a different column) reduces the performance of the read operation.

When concurrent read operations and write operations access different rows in the memory array, there is significantly less capacitance experienced such that read operations without concurrent write operations to the same row may be completed much faster. But in order to provide reliable operation with fill random access to all memory cells, the memory access speed must be limited to the worst case scenario. Thus, the memory access speed specifications are determined by the worst case scenario of concurrent read and write operations directed to the same row in the memory array.

The same situation may also be true for two concurrent write operations directed at two different memory cells within the same row. When two write operations access two memory cells in the same row of a memory array then the circuits driving the bit lines will have to deal with increased capacitance. Specifically, for both write operations, the other write operation will couple the other pair of bit lines to memory cell by activating the other pair of port transistors. Thus both write operations to memory cells in the same row experience increased line capacitance. Therefore, it may take a longer time to complete write operations directed to memory cells in the same row than if the two write operations were directed to memory cells located in different rows. The issue is generally more of a problem for read operations since write operations can use larger driver circuits that are located outside of the memory array.

Figure 13:
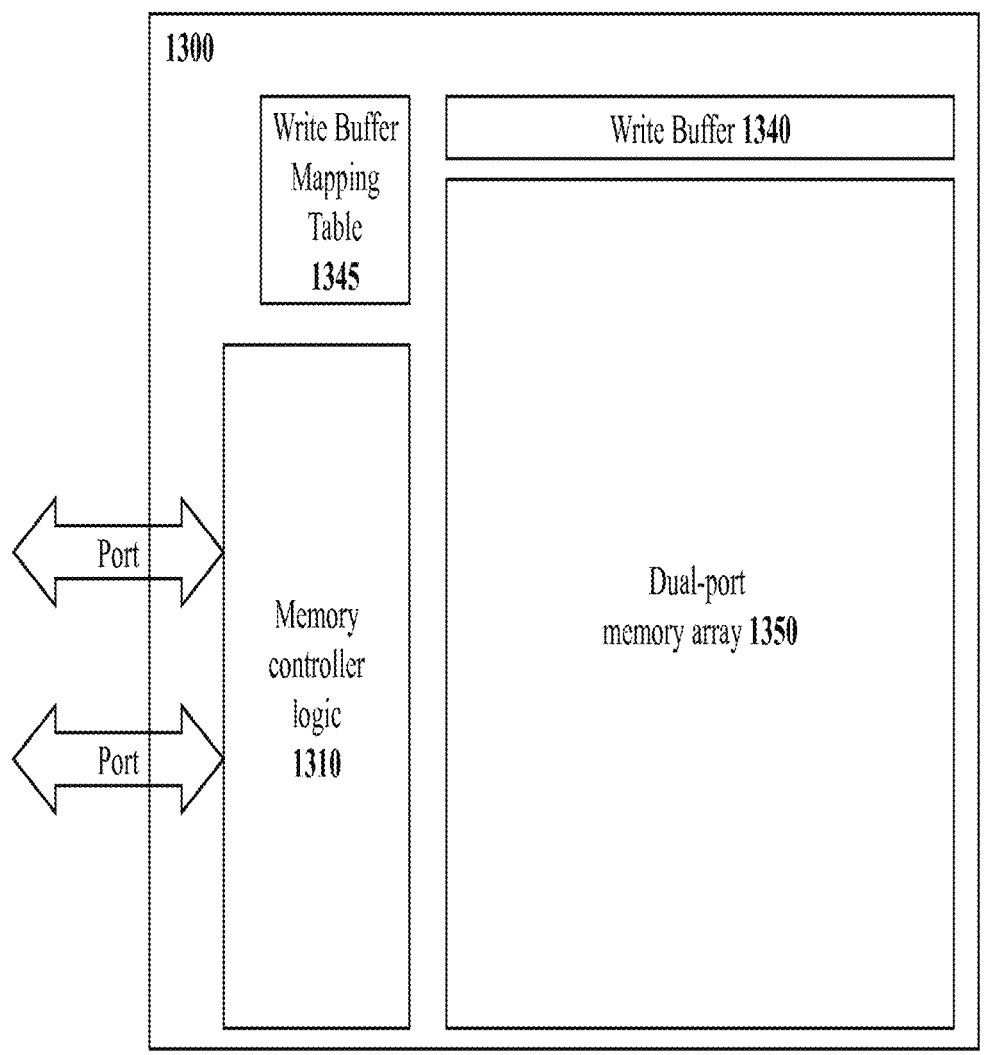
FIG. 13 illustrates a dual-port memory system that uses a write buffer to improve the performance of the memory system.

In some multi-port memory systems, a concurrent read operation and write operation to the same row causes the memory to operate slower than when two concurrent read operations to the same row are handled. (A concurrent read operation and write operation to the same row is the worst case situation.) To improve the performance of such a memory system, a write-buffer may added to handle concurrent read and write operations directed to the same row such that the two concurrent read operations to the same row then becomes the worst case situation. Thus, the overall performance of the memory system is improved. FIG. 13 illustrates a dual-port memory system that uses a write buffer 1340 to improve the performance of the multi-port memory system in such a manner.

Referring to FIG. 13, a dual-port memory system 1300 is implemented with memory controller logic 1310, a main dual-port memory array 1350, a write buffer row 1340, and a write buffer mapping table 1345. The memory controller logic 1310 handles all memory requests from users of the dual-port memory system 1300. Most data items are represented in the main dual-port memory array 1350. However, some data items may be represented in the write buffer row 1340. The memory controller logic 1310 uses write buffer mapping table 1345 to keep track of which data items are currently represented in the write buffer row 1340 instead of in the main dual-port memory array 1350.

Figure 14:
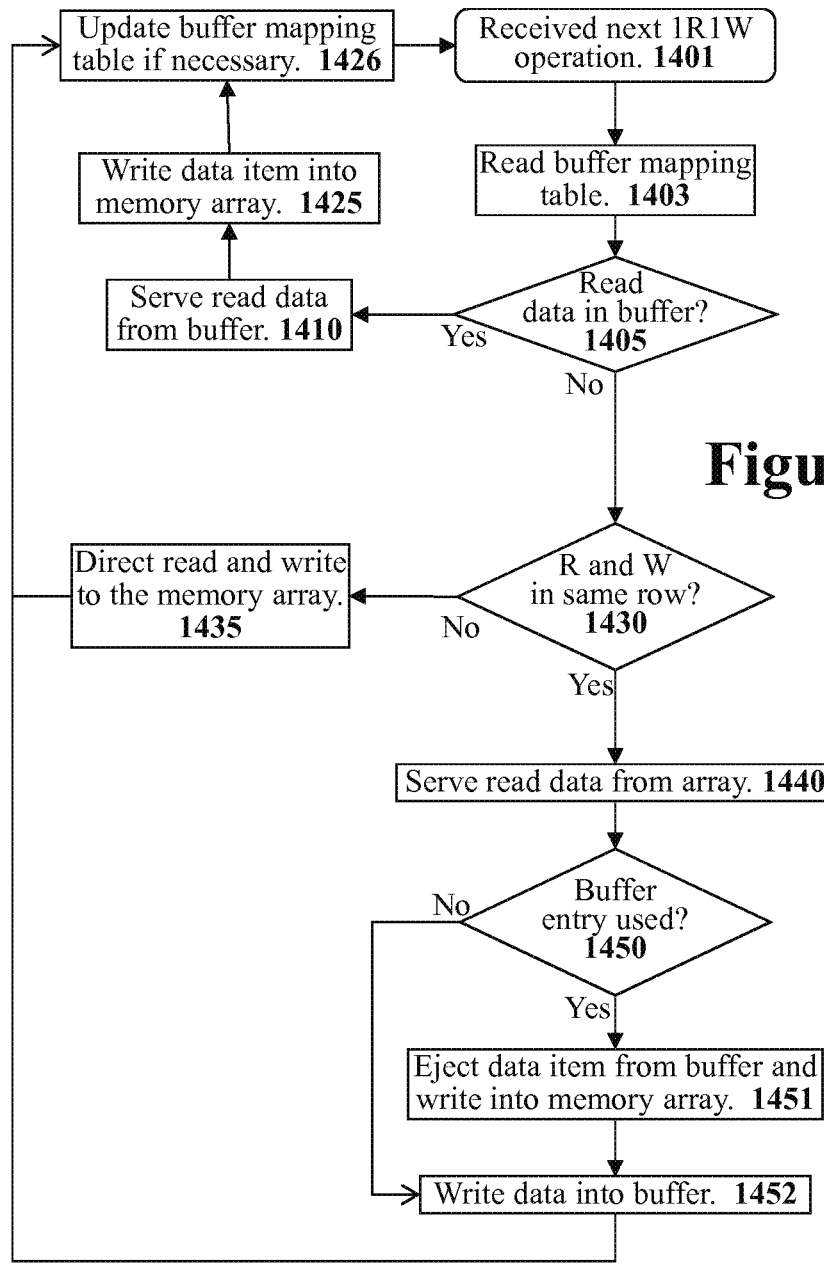
FIG. 14 illustrates a flow diagram that describes how the memory system of FIG. 13 may be improved by preventing reads and writes from concurrently accessing the same row in a memory array.

To improve memory system performance with a memory array that has reduced performance when read and write operations access the same row concurrently, the memory controller logic 1310 logic of dual-port memory system 1300 uses the write buffer row 1340 to prevent such concurrent read and write operations within the same row. FIG. 14 illustrates a flow diagram that describes how the memory controller logic 1310 handles concurrent read and write operations.

At stage 1401, the memory controller logic 1310 receives both a read operation and a write operation. The memory controller logic 1310 first reads the write buffer mapping table 1345 at stage 1403 to locate the read data. If the read data is in the write buffer row 1340 then the system proceeds through stage 1405 to stage 1410 where the read data is served from the write buffer row 1340. The write operation is handled by writing into the main dual-port memory array 1350 at stage 1425. At stage 1426, the memory controller logic 1310 will update the write buffer mapping table 1345 if the data written into the main dual-port memory array 1350 at stage 1425 was previously represented in the write buffer 1340. It must be again emphasized that operations may be listed sequentially in the flow diagrams for clarity but will generally be performed in parallel whenever possible. For example, the read operation of stage 1410 and the write operation of stage 1425 will generally be performed concurrently.

Referring back to stage 1405, if the read data is not in the write buffer row 1340 then the system determines if the read and write are attempting to access the same row at stage 1430. If the read and write operations are not attempting to access the same row in the main dual-port memory array 1350 then the memory controller logic 1310 can just proceed to stage 1435 and handle both the read and write operations with the main dual-port memory array 1350 since there is no performance penalty when the two operations do not access the same row. The system then proceeds through stage 1426 to update the buffer mapping table 1345 if necessary. For example, if the write data was previously been represented in the write buffer 1340 then the memory controller logic 1310 updates the write buffer mapping table 1345 to indicate that the write data is now represented in the memory array 1350.

If stage 1430 determines that the read and write operations are both attempting to access the same row in the main dual-port memory array 1350 then the memory controller logic 1310 uses the write buffer 1340 to prevent both operations from accessing the same row concurrently. The read operation is given priority since the read data only exists within the main dual-port memory array 1350 such that the read operation is handled by serving the data from the main dual-port memory array 1350 at stage 1440. The write operation is directed to the write buffer row 1340.

At stage 1450, the system determines if the associated entry in the write buffer row 1340 is already being used by different data address (from a different row). If the associated entry current contains valid data from a different data address, that data is ejected from the write buffer row 1340 and written into the main dual-port memory array 1350 at stage 1451. (Note that this write operation can be performed concurrently with the read from a different row at stage 1440 since the main array is a dual-port memory array.) After ejecting the data at stage 1451 or if the data entry did not store a different data address back at stage 1450, the memory controller logic 1310 writes the write data into the write buffer row 1340 at stage 1452. Finally, at stage 1426 the memory controller logic 1310 updates the write buffer mapping table 1345 to indicate the new data stored in the associated entry of the write buffer row 1340 if previously stored data was rejected at stage 1451.

The performance of a dual port memory may be limited by many different cases. As set for the in the previous paragraphs, 2W or 1R1W operations could limit the performance to a lower operating frequency, as compared to the 2R case. For example, a memory system may be able to operate at a clock frequency of 1.3 GHz for the 2R case, but only be able to operate at a clock frequency of 1 GHz when 2W or 1R1W operations occur due to the slow down when the operations access the to the same or adjacent rows. Thus, using the technique set forth in the previous paragraphs will eliminate the performance bottleneck from the 2W and 1R1W operations case and thereby allow the dual port memory system to operate at a clock frequency of 1.3 GHz at all times.

High-Speed 1 R1W Two-Port Memory System from Dual-Port Memory

In the previous section, the techniques set forth with reference to FIGS. 13 and 14 improve the performance of 1R1W operations and 2W operations that access the same row. However, two read operations (2R) that access the same row in a memory array cannot be improved with a write buffer since read data can only be obtained from where the valid read data resides. Thus, if a write buffer is used to improve the performance of 1R1W and 2W operations to the same row then two read operations (2R) may become the worst case scenario that limits the performance of a dual-port memory system.

However, many memory applications do not require dual-port memory systems that have two completely independent memory ports but can instead operate with a two-port memory system wherein one port only handles read operations and the other port only handles write operations. Thus, if one uses the techniques set forth with reference to FIGS. 13 and 14 improve the performance of 1R1W operations of a dual port memory system and labels the memory system as a 1RI W two-port memory system, a dual port memory system may be used to construct a high-speed IR1W two-port memory system.

When a dual-port memory system is used as a 1R1W two-port memory system, the performance of the memory system is limited only by the speed at which IR1W operations can be done (2R and 2W operations will not be performed). If the dual-port memory system can handle 1R1W operations to different rows at a clock frequency of 1.3 GHz but can only handle 1R1W operations to the same/adjacent row at a clock frequency of I GHz then the techniques from the previous section may be used to improve the 1R1W performance of the two-port memory system. Specifically, a write buffer may be added to handle write operations when the write operation is directed at the same row as the read operation. In this manner, the 1RI W two-port memory system can always operate at the full 1.3 GHz clock rate. Thus, a high performance 1R1W two-port memory system comprising one read port and one write port may be constructed from a dual-port memory system that includes a write buffer.

The preceding technical disclosure is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim is still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72(b), which requires that it allow the reader to quickly ascertain the nature of the technical disclosure. The abstract is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A dual-port random access memory system, comprising:
   a memory array comprising a plurality of memory cells, each of the plurality of memory cells comprising a memory element coupled to a power line that provides an operation voltage to the memory element, each memory cell comprising:
      a first bidirectional memory port coupled to a data side of the memory element, the first bidirectional memory port controlled by a first word line for performing a first single-ended read or write operation, and
      a second bidirectional memory port coupled to a data-complement side of the memory element, the second bidirectional memory port controlled by a second word line for performing a second single-ended read or write operation; and
   a memory controller configured to control the operation voltage provided by the power line, wherein the memory controller is configured to increase the operation voltage to a normal power supply voltage when performing a read operation on the memory element and decrease the operation voltage to a reduced voltage level that is lower than the normal power supply voltage at other times.

2. The dual-port random access memory system of claim 1, wherein the memory element comprises a pair of inverters.

3. The dual-port random access memory system of claim 2, wherein each of the plurality of memory cells consists of a total of six transistors.

4. The dual-port random access memory system of claim 3, wherein each of the plurality of memory cells comprises two port transistors and each of the pair of invertors includes a PMOS transistor and a NMOS transistor, the NMOS transistor has a size approximately 1.5 times as large as a port transistor and the PMOS transistor is approximately the same size as the port transistor.

5. The dual-port random access memory system of claim 1,
   wherein the reduced voltage level is lower than a voltage level on the first word line and the second word line when a write operation is performed on the respective bidirectional memory port.

6. The dual-port random access memory system of claim 5, further comprising:
   a voltage reference generation circuit configured to generate a reference voltage value, and
   a sense amplifier with a first input coupled to the voltage reference generation circuit and a second input coupled to an output of the first bidirectional memory port, wherein the sense amplifier is configured to perform a pseudo differential read operation by comparing the output of the first bidirectional memory port with the reference voltage value.

7. The dual-port random access memory system of claim 1, wherein the plurality of memory cells of the memory array are formed into a plurality of memory rows, each of the plurality of memory rows has a plurality of columns that share one common power line, wherein the memory controller is configured to execute two concurrent memory access operations in a single operating cycle.

8. The dual-port random access memory system of claim 7, wherein the two concurrent memory access operations are two read operations, two write operations, or one read operation and one write operation.

9. The dual-port random access memory system of claim 7, further comprising:
   a write buffer having an equal number of columns as the memory array; and
   a write buffer mapping table specifying contents of the write buffer;
   wherein said memory controller is configured to write into the write buffer for a write operation when the write operation and a concurrent read operation are directed at a common row of the memory array and to update the write buffer mapping table with a row address of the common row.

10. The dual-port random access memory system of claim 8, wherein the write buffer comprises two rows.

11. A method of operating a dual-port random access memory system, comprising:
    maintaining an operation voltage provided on a power line to a memory element of a memory cell of the dual-port random access memory system at a reduced voltage power level, the reduced voltage power level being lower than a normal power supply voltage;

raising the operation voltage provided on the power line to the normal power supply voltage when performing a single-ended read operation on the memory element, wherein the memory cell comprises:

a first bidirectional memory port coupled to a data side of the memory element, the first bidirectional memory port controlled by a first word line for performing a first single-ended read or write operation, and a second bidirectional memory port coupled to a data-complement side of the memory element, the second bidirectional memory port controlled by a second word line for performing a second single-ended read or write operation; and lowering the operation voltage provided on the power line back to the reduced voltage level after the read operation is completed.

12. The method of claim 11, wherein the memory element comprises a pair of inverters.

13. The method of claim 12, wherein the dual-port random access memory system comprises a plurality of the memory cells and each of the plurality of memory cells consists of a total of six transistors.

14. The method of claim 13, wherein each of the plurality of memory cells comprises two port transistors and each of the pair of inverters includes a PMOS transistor and a NMOS transistor, the NMOS transistor has a size approximately 1.5 times as large as a port transistor and the PMOS transistor is approximately the same size as the port transistor.

15. The method of claim 11, further comprising applying a write voltage level on the first word line or the second word line to perform a write operation on the first bidirectional memory port or the second bidirectional memory port respectively, and the write voltage level being higher than the reduced voltage level.

16. The method of claim 15, further comprising performing a pseudo differential read operation by comparing the output of the first bidirectional memory port with a reference voltage value.

17. The method of claim 11, wherein the dual-port random access memory system comprises a plurality of memory cells formed into a plurality of memory rows and each of the plurality of memory rows has a plurality of columns that share one common power line, wherein the method further comprises executing two concurrent memory access operations in a single operating cycle.

18. The method of claim 17, wherein the two concurrent memory access operations are two read operations, two write operations, or one read operation and one write operation.

19. The method of claim 17, further comprising:
writing into a write buffer for a write operation when the write operation and a concurrent read operation are directed at a common row of memory cells in the dual-port random access memory system; and
updating a write buffer mapping table with a row address of the common row, the write buffer mapping table specifying contents of the write buffer.

20. The method of claim 19, wherein the write buffer comprises two rows.

* * * * *